United States Patent
Honkura

(10) Patent No.: US 9,857,436 B2
(45) Date of Patent: Jan. 2, 2018

(54) HIGH SENSITIVE MICRO SIZED MAGNETOMETER

(71) Applicant: MAGNEDESIGN CORPORATION, Chita-gun, Aichi-ken (JP)

(72) Inventor: Yoshinobu Honkura, Chita-gun (JP)

(73) Assignee: MAGNEDESIGN CORPORATION, Aichi-ken (JP)

( * ) Notice: Subject to any disclaimer, the term of this patent is extended or adjusted under 35 U.S.C. 154(b) by 86 days.

(21) Appl. No.: 15/043,125

(22) Filed: Feb. 12, 2016

(65) Prior Publication Data

US 2016/0238673 A1    Aug. 18, 2016

(30) Foreign Application Priority Data

Feb. 16, 2015   (JP) .................................. 2015-027092

(51) Int. Cl.
    *G01R 33/06*    (2006.01)
    *G01R 33/12*    (2006.01)
(52) U.S. Cl.
    CPC .......... *G01R 33/06* (2013.01); *G01R 33/1284* (2013.01); *G01R 33/1292* (2013.01)
(58) Field of Classification Search
    CPC .... G01R 33/0023; G01R 33/09; G01R 33/06; G01R 33/063; G01R 33/1284; G01R 33/1292
    See application file for complete search history.

(56) References Cited

U.S. PATENT DOCUMENTS 2,856,581 A    10/1958   Alldredge
6,232,775 B1 *  5/2001   Naitoh .................... C22C 38/10
                                                        148/305

(Continued)

FOREIGN PATENT DOCUMENTS

JP    2617498 B2    6/1997
JP    3197414 B2    8/2001

(Continued)

OTHER PUBLICATIONS

Jun. 5, 2015 Office Action issued in Japanese Patent Application No. 2015-027092.

(Continued)

*Primary Examiner* — Huy Q Phan
*Assistant Examiner* — Adam Clarke
(74) *Attorney, Agent, or Firm* — Oliff PLC

(57) ABSTRACT

The magnetometers possess detector part with a magnetic wire sensitive to magnetic field consisting of a domain structure of the surface domain with circular spin alignment and core domain with longitudinal spin alignment and micro coil surrounding its magnetic wire to pick up the change of longitudinal magnetizing caused by spin rotation in surface domain with circular spin alignment called as GSR effect excited by pulse with frequency of 0.5 GHz to 4 GHz. Peak coil voltage is detected by a circuit characterized with pulse generator, GSR element, Buffer circuit, sample holding circuit, amplifier circuit and means to invert it to external magnetic field. The induced coil voltage caused by parasitic coil capacitance and wiring loop is vanished by combination coil of right and left turn coil. The magnetometers can provide lower noise, wide measuring range with a small size detector part and is applied to smartphones, wearable computer and so on.

7 Claims, 9 Drawing Sheets

(56) References Cited

U.S. PATENT DOCUMENTS

| | | | | |
|---|---|---|---|---|
| 2005/0116708 A1* | 6/2005 | Honkura | ............... | G01R 33/02 324/249 |
| 2005/0242805 A1* | 11/2005 | Honkura | ............... | G01R 33/02 324/249 |
| 2011/0080164 A1* | 4/2011 | Honkura | ............... | B82Y 25/00 324/244 |
| 2012/0038358 A1* | 2/2012 | Honkura | ............. | G01R 33/063 324/252 |
| 2013/0181705 A1* | 7/2013 | Honkura | ............. | G01R 33/063 324/252 |
| 2015/0219731 A1* | 8/2015 | Yamamoto | .......... | G01R 33/063 324/252 |
| 2015/0323612 A1* | 11/2015 | Latham | ............... | G01R 33/096 324/251 |

FOREIGN PATENT DOCUMENTS

| | | | |
|---|---|---|---|
| JP | 2002365349 A | 12/2002 |
| JP | 3645116 B2 | 5/2005 |
| JP | 3801194 B2 | 7/2006 |
| JP | 2006-300906 A | 11/2006 |
| JP | 2010-273799 A | 12/2010 |
| JP | 4655247 B2 | 3/2011 |
| JP | 2012-078198 A | 4/2012 |
| WO | 2005/019851 A1 | 3/2005 |
| WO | 2009/119081 A1 | 10/2009 |
| WO | 2014/115765 A1 | 7/2014 |

OTHER PUBLICATIONS

Aug. 24, 2015 Office Action issued in Japanese Patent Application No. 2015-027092.

Kaneo-Mohri, "The Theory and Technology on the magnetometer." Published by Corona Publishing Co., Ltd. in 1998.

Kaneo-Mohri "The new Magnetometers and their applications." published by Triceps Co., in 2013.

Nov. 4, 2015 Office Action issued in Japanese Patent Application No. 2015-027092.

* cited by examiner

HIGH SENSITIVE MICRO SIZED MAGNETOMETER

TECHNICAL FIELD

The present invention is related to the high sensitive micro sized magnetometer called as GSR sensor based on spin rotation effect with ultra-high speed powered by GHz pulse current.

BACKGROUND ART

A lot of types of High sensitive micro sized magnetometers have been developed since 1936 which consist of magnetic wire types named as Parallel-gated Flux gate sensor, Orthogonal-gated Flux Gate sensor, MI sensor, Coil type MI sensor, and high frequency carrier type sensor based on magnetic wire technology and magnetic thin film types named as Hall sensor, MR sensor, and tMR sensor based on semiconductor technology.

At present many types of the electronics compass based on these sensors except high frequency carrier type sensor are widely used for navigation service in smartphone and automobile. High performance types based on Parallel-gated Flux gate sensor, Orthogonal-gated Flux Gate sensor, MI sensor, and Coil type MI sensor are developed. Low cost types based on Hall sensor, MR sensor, and tMR sensor are developed. In future the compass with higher performance and lower cost will be expected to be used as a motion input device of wearable computer.

Thin film types named as hall sensor, GMR senor, and tMR sensor are advantage in cost and mass production but not so good in sensitivity, heat resistance and current consumption. The present inventor made efforts to invent the ultra-high sensitive micro sized magnetometer based on new technology combined with magnetic wire technology and semiconductor technology.

Parallel-gated Flux gate sensor developed in 1936 has been achieved to detect a static magnetic field of nT (nano tesla) level by the means of the pickup coil to measure the amplitude of the second harmonics of the incremental deference of two magnetic wire magnetizations which were respectively magnetized by one right turn coil and other left turn coil to pass through AC current of 30 KHz.

Orthogonal-gated Flux sensor hereafter called as FG sensor, developed in 1952 referred as patent literature 1 has achieved smaller size of the wire length of 50 mm than that of Parallel-gated Flux gate sensor by the means of the coil binding the wire to detect the rotation of the longitudinal magnetization of the wire excited by AC current of 30 KHz.

The FG sensor excited by pulse current with frequency of 500 KHz was invented in 1988 referred as patent literature 2 to improve sensitivity with a magnetic amorphous wire with length of 50 mm and resistivity of 100 μΩcm. The magnetic property of the amorphous wire with the diameter of 125 μm used had permeability of over 3000 same to permalloy used in FG sensor. The magnetic domain structure of both alloy consisted of longitudinal domains formed by 180 degree walls.

The principle of FG sensor is to measure the rotation of longitudinal magnetization of the wire vibrated by the movement of the 180 degree magnetic wall forced by the circular magnetic field produced by AC current or Pulse current. The longitudinal magnetization of the wire is lowered by the diamagnetic field inverse proportional to the wire length. It is difficult to decrease the wire length without the decrease of the sensor sensitivity, which means that a ultra-high sensitive micro sized magnetometer cannot be developed based on FG sensor technology.

MI sensor referred in patent literature 3 was developed in 1993 on the base of magneto impedance effect called as MI effect. The magneto impedance effect appears on passing the AC current with frequency of 10 MHz to 100 MHz through a magnetic amorphous wire.

The magneto-impedance of the wire is drastically increased dependent on the external magnetic field due to the skin effect induced by high frequency current. The external magnetic field can be detected from the relationship between the external magnetic field and the impedance change. The influence of the frequency on the magneto-impedance shows it has a maximum value at 10 MHz and decreases beyond 10 MHz due to eddy current increased proportional to frequency.

However, MI sensor had some drawback to give the poor properties in non-linearity and not negligible hysteresis. These problems could be solved using a negative feedback circuit and a bias coil which were accompanied with big current consumption. The details on MI sensor technology has been explained in the Non patent literature 1 named as "the theory and technology on the magnetometer" written by Kaneo Mohri published by CORONA PUBLISHING CO.LTD in 1998.

A coil type of MI sensor referred in patent literature 4 was developed in 1999 to achieve linear output detected by the coil surrounding the enameled wire around the magnetic amorphous wire.

The magneto-impedance effect of the magnetic amorphous wire is caused by passing the AC current with the frequency of 10 MHz. This wire has the special magnetic domain structure consisting of the core domain with the longitudinal spin alignment, the surface domain with the circular spin alignment and 90 degree magnetic wall between both domains. When the AC current is passed through the wire, the magnetic wall is vibrated from the surface to the inner side alternately, accompanied with vibration of magnetization rotation. The magnetization rotation is detected by the coil surrounding the wire as its voltage.

The structure of the coil type of MI sensor is same to that of FG sensor referred as patent literature 2. The 180 degree magnetic walls of the wire can move easily up to around the frequency of 30 KHz due to resisting power of eddy current increased with the frequency. However, MI sensor is caused by movements of the 90 degree magnetic wall between the core domain and the surface domain. The 90 degree magnetic wall can move easily up to around the frequency of 200 MHz because the boundary connected to the surface domain with circular spin alignment is easily moved by circular magnetic field.

The coil voltage increases with $f^{1/2}$ of the frequency f so that MI sensor operated with 200 MHz could provide about 100 times larger coil voltage than that of FG sensor operated with 30 KHz.

Other advantage of the coil type MI sensor using the wire diameter of 30 μm could be achieved from 50 mm of FG sensor to the short wire length of 3 mm. It is noted both sensors have same structure but are operated by deferent frequency.

However its type used the negative feedback circuit to decease the hysteresis which made serious drawback to increase the current consumption.

Subsequently the plating coil type of MI sensor referred in patent literature 5 was developed in 2004 to decrease the current consumption by omitting a negative feedback circuit. In addition it could provide its small sensor size by the small sized MI element which was produced by plating process on the substrate.

The pulse annealing method instead of a negative feedback circuit is applied to the plating coil type of MI sensor for vanishing the hysteresis or improving the linearity. While the rectangular pulse is applying to the wire, the 90 degree magnetic wall goes from the surface to the wire center to vanish the hysteresis. The coil voltage detected at the moment of pulse falling gives no hysteresis.

The small sized element consisted of the magnetic amorphous wire with the diameter of 12 μm and length of 0.6 mm and the coil with the inner diameter of 30 μm and the pitch of 30 μm.

This type of MI sensor is widely used as the electronics compass named as AMI306 in the mobile phone which has measuring range of ±10 G using the amorphous wire with the anisotropy field of 20 G.

The electric circuit of the coil type MI sensor consists of the Pulse generator, MI element with the coil, the sample holding circuit equipped with an electronics switch and a capacitor, detection timing adjusting circuit, and a programming amplifier. It can detect the holding voltage of the capacitor given by integrating the current induced in the coil during a period which takes coil voltages from zero voltage to the peak voltage. The holding voltage V corresponds to the magnetization M of the wire related to the external magnetic field expressed by the equation of M=χH. The external magnetic field H is calculated from the voltage V within the linear region between the external magnetic field H and the magnetization M. The measuring range keeping the linearity would be about 30% of the maximum external magnetic field measured at the peak voltage.

The MI sensor to measure the magnetic impedance has the optimum frequency of 10 MHz because the magnetic impedance expressed as combination of a real part and imaginable part corresponds to the energy loss against the AC current. Its skin effect increases the real part of the impedance to give the maximum magnetic impedance at the frequency of 10 MHz.

However the coil type MI sensor measures the coil voltage caused by the rotation of the magnetization M. The rotation of the magnetization increases the imaginal part of the impedance to give the maximum coil voltage at the frequency of 200 MHz.

Above mentioned, the high sensitive micro sized magnetometers have progressed in sensitivity and small size based on magnetic wire technology since 1936. The coil voltage is expressed by the equation (1) which shows the tradeoff relationship between sensitivity, element size and measuring range. It can increase by means of the improvement of the wire properties, increase of frequency and micro coil with the coil pitch of under 10 μm.

$$V \propto N \cdot f^{1/2} \cdot \mu \cdot Hex \cdot D \cdot L \quad (1)$$

The performance of sensors can be estimated by the index defined as S=W/KLD where K means sensitivity or noise, LD means volume, and W means measuring range.

Its performance of various sensors were calculated as bellow.

FG sensor operated with frequency of f=30 KHz has index S=0.1 when noise of K=0.2 mG, measuring range of W=2 G, length of L=50 mm, diameter of D=2 mm.

MI sensor operated with frequency of f=10 MHz has index S=60 when noise of K=0.2 mG, measuring range of W=2 G, length of L=5 mm, diameter of D=0.03 mm.

The plating coil type MI sensor operated with frequency of f=200 MHz has index S=800 when noise of K=2 mG, measuring range of W=10 G, length of L=0.6 mm, diameter of D=0.01 mm.

The progress on the performance of those sensors have been caused by increase of the frequency from 30 KHz via 10 MHz to 200 MHz. The epoch making innovation in progress was to discover MI effect caused by vibrating 90 degree wall existing between the core magnetic domain and the surface magnetic domain. The details of the progress of MI sensor has been explained in Non patent literature 2 named as "the new magnetometers and their applications" written by Kaneo Mohri published by Triceps Co. in 2012.

Nowadays these type of high sensitivity micro sized magnetometers are widely used as the electronics compass in smart phones and in future are expected to improve high sensitivity from 2 mG to 0.2 mG and wide measuring range from ±10 G to ±40 G, small size of element from 0.6 mm to 0.2 mm and low current consumption for application to the motion sensor for wearable computers. In other words, the index S of the performance must be improved to 100,000 when K=0.2 mG, W=40 G, L=0.2 mm, D=0.01 mm.

The inventor invented the MI sensor with more high sensitivity driven by high frequency pulse of 0.3 GHz to 1.0 GHz referred in patent literature 6 in 2009 but gave up the development of commercial product because there were a lot of problems such as big noise accompanied with high frequency pulse, increase of the parasitic capacitance of the pickup coil and difficulty to make design of electronic circuit to detect the coil voltage because it is very fast.

CITATION LIST

Patent Literature

Patent Literature 1 U.S. Pat. No. 2,856,581
Patent Literature 2 Japan Patent No. 2617498
Patent Literature 3 Japan Patent No. 3197414
Patent Literature 4 Japan Patent No. 3645116
Patent Literature 5 Japan Patent No. 3801194
Patent Literature 6 Japan Patent No. 4655247
Patent Literature 7 WO2014/115765A Non Patent Literature Non patent literature 1 "the theory and technology on the magnetometer" written by Kaneo Mohri published by CORONA PUBLISHING CO.LTD in 1998.

Non patent literature 2 "the new magnetometers and their applications" written by Kaneo Mohri published by Triceps Co. in 2012.

SUMMARY OF INVENTION

Technical Problem

The problem to be solved is to study the possibility to improve the performance of the coil type MI sensor for developing new type of ultra-high sensitivity micro sized magnetometer based on the possibility.

The equation (1) suggests the possibility that the coil voltage V increases with increase of coil turns N, wire permeability μ and pulse frequency f if the permeability takes not so big drop even though the pulse frequency is over 0.2 GHz. However increase of coil turns is accompanied with increase of resistance and parasitic capacitance of the coil which result in the decrease of the coil voltage.

The increase of the pulse frequency makes bad influence such as increase of the circuit noise, decrease of permeability of the wire dependent on the frequency and increase of parasitic coil capacitance which result in decrease of the coil voltage.

The present inventor studied how to suppress the bad influence accompanied with increase of coil turns N, wire permeability μ and pulse frequency f.

This study was carried out to use glass coated amorphous wire with permeability of over 2000 with tension annealing, the micro coil with the diameter of under 25 μm and the coil pitch of under 10 μm and the pulse current with frequency of from 0.5 GHz to 4 GHz and the current strength of 50 mA to 300 mA.

This study made clear about the multisided relationship among the electromagnetic phenomena excited by pulse current, the coil voltage, external magnetic field, the influence of element design on parasitic capacitance and circuit design to suppress increase of the noise caused by high frequency.

Solution to Problem

The inventor examined the effect of the permeability and the diameter of the wire, the numbers of the coil turns and the pulse frequency and current strength of the exciting pulse in details using micro coils. He found that the coil voltage picked up by the micro coil with the coil of 5 μm pitch and 15 μm coil inner diameter increased with the pulse frequency at under 2 GHz and reached maximum value at 2 GHz following decreased with increase of frequency at over 2 GHz. In the case of 0.20 mm wire length, the measuring range of ±40 G was obtained.

The patent literature 6 reported some different conclusion shown in FIG.4 that the coil voltage picked up by the plating coil with coil pitch of 30 μm and coil inner diameter of 30 urn increase with the pulse frequency and reached maximum value at 0.5 GHz followed by big decrease at 1 GHz shown as (B) and (C). In the case of 0.6 mm wire length, the measuring range of ±2 G and ±30 G was obtained according to different permeability respectively. The present invention can offer higher sensitivity and wider measuring range than that of the plating coil type MI sensor.

There is difference on optimum frequency between the micro coil and the plating coil. The amount of change of longitudinal magnetization became small inverse proportional to frequency given as $f^{1/2}$. However the micro sized coil can detect small signal at 1 GHz to 3 GHz due to the strong electromagnetic coupling between the wire surface and the coil.

It is supposed that the micro coil can detect a weak signal proportional to $f^{1/2}$ but high speed signal induced by high frequency pulse proportional to f so that it can provide the coil voltage proportional to the frequency given as $f^{1/2}$. By the way, when the pulse frequency is over 4 GHz, the coil voltage drop drastically probably due to the precession motion and strong eddy current.

In the study he discovered the experimental equation (2) to give the relationship between the coil voltage and the external magnetic field when the pulse with the pulse frequency of 0.5 GHz to 4 GHz was applied to the magnetic amorphous wire.

$$Vs = Vo(\mu, Ms, \rho, L, D, p, Nc, f)\sin(\pi H/2Hm) \quad (2)$$

Where, Vs means the pickup coil voltage, H is the external magnetic field, and Hm is the maximum external magnetic field to get the maximum coil voltage and Vo is the proportional constant dependent on the permeability μ, saturation magnetic flux density Ms, resistivity ρ of the wire material, the length L of the wire, the diameter D of the wire, the skin depth p of the pulse current, coil turn numbers Nc, and frequency f.

At first the theoretical relationship between the coil voltage Vs expressed by the equation (1) and the angel θ of spins around wire surface caused by the external magnetic field is discussed and the theoretical conclusion suggests that the relationship is expressed by the equation (3).

$$V = V_2 \sin 2\theta \quad (3)$$

Where, $V_2$ is the proportional constant dependent of any parameters except θ.

As bellow is the discussion on the relationship.

The coil voltage Vs is proportional to the velocity of the magnetic flux, that is, $V = -d\Phi/dt$. When spins are tilt with the angle θ toward longitudinal direction the magnetic flux $\Phi x(\theta)$ parallel to the longitudinal direction is shown as $\Phi x(\theta) = ms \cdot L \cdot \pi D \cdot d \cdot \sin \theta = \Phi_0$ ux where ux is a longitudinal component of unit vector of spin. The unit vector u of spin is rotated with the angular velocity ω which is expressed as $\omega = d\theta/dt = 2\pi f$ where pulse frequency f is constant. The x axis velocity dux/dt of x-component ux of the unit vector is expressed as $\cos \theta \Delta\theta/\Delta t$ where $\Delta\theta/\Delta t = \omega \Delta t = 2\pi f$.

Starting spins rotation, the coil voltage Vs is expressed as $$V = -d\Phi x(\theta)/dt = -\Phi_0 ux \cdot dux/dt = -\Phi x(\theta) \cdot \cos \theta \cdot 2\pi f = ms \cdot L \cdot \pi D \cdot d \sin \theta \cdot \cos \theta \cdot 2\pi f = -ms \cdot L \cdot \pi D \cdot d \cdot \pi f \sin 2\theta.$$

As a result, the coil voltage is proportional to sin 2θ expressed as the equation (3).

If the experimental equation (2) would give $2\theta a = \pi H/2Hm$, the equation (2) are expressed proportional to sin 2θa where θa is defined as the equation (4).

$$\theta a = \pi H/4Hm \quad (4)$$

The relationship between θa and θ is discussed as below.

The spins angle θ is theoretically defined as the angle determined by the ratio Hin/Kθ of anisotropy field Kθ toward the circular direction and internal magnetic field Hin toward the longitudinal direction expressed by the equation (5)

$$\tan \theta = Hin/K\theta \quad (5)$$

where Hin is the internal magnetic field corrected by demagnetizing field and Kθ is anisotropy field toward the circular direction.

If θ=θa, the θa defined in the equation (3) means the spin angle tilt toward the longitudinal direction induced by the applied external magnetic field.

Before the relationship between θa and θis discussed, the factors of Hm, Hin and Kθ on the magnetic wire properties are explained using FIG. 1A and FIG. 1B which show the magnetizing curve for the longitudinal direction induced by the longitudinal applied magnetic field Hx and the coil output voltage induced by the circular applied magnetic field Hθ respectively.

The magnetizing curve against the magnetic field consists of two regions to show the sharp rising due to the movement of magnetic walls and to show the gradual increase due to the rotation of the magnetization. The strength of the anisotropy field Hk is defined as the field value to become M/Ms=0.90 which means the start of the magnetization rotation.

The magnetization M is expressed as M=χH where χis expressed as the equation (6)

$$\chi = \chi_0\{1 - \beta \times (H/Hk)^2\} \quad (6)$$

where β is 0.10.

The effective inner magnetic field Hin is dependent on the demagnetizing field and is expressed as Hin=H−NM, where N is a factor of the demagnetizing field. By substituting the equation (6) to Hin=H=NM, the equation (7) is gained.

$$Hin=H\{1-N\chi o+\beta N\chi o(H/Hk)^2\} \quad (7)$$

By the way, N=0 in the case of the wire with the infinite length and N increases with the decrease of the wire length.

When the magnetic field of Hk is applied, the spin angle becomes 45 degree so that the relation of Hin=Kθ is obtained from the equation (5). The inner magnetic field Hin is defined as Hin=H−NχH so that Kθ=Hk−NχHk. When the magnetic field H takes Hk, the equation (6) gives the relation of χ=(1−β)χo. From both relations of Kθ=Hk−NχHk and χ=(1−β)χo, the equation (8) is obtained.

$$K\theta=\{1-(1-\beta)N\chi o\}Hk \quad (8)$$

Hin given by the equation (7) and Kθ given by the equation (8) are substituted to the equation (5) of tan θ=Hin/Kθ, the equation (9) is obtained.

$$\tan\theta=H/Hk\{(1-N\chi o)+\beta N\chi o(H/Hk)^2\}/\{1-(1-\beta)N\chi o\} \quad (9)$$

The above discussion suggests there are two angles of θ and θa. θ is defined as the spin angle by the theoretical equation of tanθ=Hin/Kθ dependent on Hk which is measured from the magnetizing curve of the longitudinal magnetic field. On the other hand, θa is defined as θa=πH/4Hm by the experimental result dependent on Hm which is measured using the circular magnetic field.

The following discussion proves that both angle are equal, that is, θ=θa.

At first the experiment of the inventor resulted that the relationship between Hk and Hm is nearly equal as Hm=αHk with α=0.96.

The coil voltage Vs is changed by the external magnetic field H. It increases with increase of the external magnetic field H up to H=Hm, which gives the maximum value of the coil voltage and it gradually decreases over Hm.

When H=Hk, the core domain is saturated and the spins in the surface domain takes the tilt angle θ of 45 degree not 90 degree because the spins with over 45 degree exists inside of the 90 degree wall going out from the surface domain. When H=Hm, all spins in the surface domain reaches to 45 degree which means the maximum angle for surface spin because the surface domain is affected by the leak field as the demagnetizing field which is a little smaller than the demagnetizing field in the core domain from the saturated core magnetization. When H reached to Hk, all spins in the surface domain keeps 45 degree.

When H is over Hk, the 90 degree wall existing between the core domain and the surface domain is going into the surface domain. At last it reaches to the top surface keeping the 45 degree angle of the spins in the surface domain and the surface domain vanishes.

The above discussion suggests that the experimental result of α=0.96 is reasonable to match the current magnetization theory.

Next step of the discussion is to explain the reason to take the relationship of θ=θa.

The approximation of tan θa where θa=πH/4Hm is given as the bellow equation.

$$\tan\theta a=\theta(1+1/3\times\theta^2)=(H/Hm)\{\pi/4+1/3\times(\pi/4)^3 (H/Hm)^2\} \quad (10)$$

Subtituting Hm=αHk to the equation (10), the equation (11) is obtained.

$$\tan\theta b=(H/Hm)\{\alpha(1-N\chi o)+\beta N\chi o\alpha^3(H/Hm)^2\}/\{1-(1-\beta)N\chi o\} \quad (11)$$

Comparing the equation (10) with the equation (11), it is clear that both expressions have same function form. If the first terms and second terms are same respectively, that is, first term relation as (12) and second term relation as (13), it is concluded that both equations are same to give θ=θa.

$$\pi/4=\alpha(1-N\chi o)/\{1-(1-\beta)N\chi o\} \quad (12)$$

$$1/3\times(\pi/4)^3=\beta N\chi o\alpha^3/\{1-(1-\beta)N\chi o\} \quad (13)$$

Nχo and β can be eliminated from both equations and a cubic equation of α is obtained. When solving the equation, α=0.96 is obtained. It is concluded that if a is 0.96, θ=θa.

This conclusion is supported by the experiment fact that α=0.96.

When the magnetic field H is small, the second term must be neglected. From the first term relationship, Nχo is obtained as the equation (14).

$$N\chi o=1/(1+4.49\beta) \quad (14)$$

This equation shows the magnetization coefficient N is in inverse proportion to magnetic susceptibility $\chi_o$. As the permeability μ=1+χ, μ of large value is nearly to χ. It is known that Nχo=1 for the ideal magnetic material with no anisotropy magnetic to offer β=0. For practical magnetic material with some anisotropy magnetic field which gives β=0.10, Nχo=0.70 is obtained.

The summary of discussions concluded that when the pulse with the frequency of 0.5 GHz to 4 GHz was applied to the wire, the spin rotation in the surface domain was caused to make the change of the longitudinal magnetization without the movement of magnetic walls. In the case to pick up the change using micro coil, the coil voltage was given by the equation (2) dependent on the spin angle θ defined as the ration of the circular anisotropy field Kθ and the effective magnetic field Hin.

In the experiment to detect the coil voltage, the pulse current applied has the enough current strength to saturate the circular magnetization and the pulse frequency of 0.5 GHz to 4 GHz.

The pulse frequency is defined as f=½Δt, where Δt is the transition period of the rising and the falling of the pulse. The skin depths of the pulse current are 0.1 μm to 1 μm which are smaller than the surface domain thickness. The pulse width is over 5 nsec which is enough time to avoid the interference of the both coil voltages induced at the rising and falling of the pulse.

When the external magnetic field forward longitudinal direction is applied to the amorphous wire having two phase domains mentioned above, the magnetization M toward the longitudinal occurs in the surface domain because the spins in the surface domain are tilted at θ from θ=0 to longitudinal direction and it is estimated that M=2πDLp·Ns·ms·sin θ, where Ns is the numbers of spins per unit volume, ms is the magnetic moment of one spin, 2πDLp is the volume of the surface domain calculated from the wire diameter D, the wire length L and the thickness of the surface domain. On the other hand the magnetization M toward the longitudinal occurs in the core domain due to movement of the 180 degree magnetic walls portioning in the core domain.

When the pulse pass through the wire mentioned above, the spins in the surface domain rotate simultaneously with very short time of At forced by the circular magnetic field about 60 G produced by the pulse. The coil detects the change of the longitudinal magnetization as the coil voltage. The coil voltage increases proportional to p·Nc·f shown in the equation (2). The skin depth p decreases proportional to $f^{1/2}$ so that the coil voltage increases proportional to the product of the coil turn numbers Nc and frequency $f^{1/2}$.

The discussion on magnetizing process in the amorphous wire is useful for understanding the basic phenomena of GSR effect.

FIG. 2 shows the magnetic domains of the wire consisting of the core domain with longitudinal spins and the surface domain with circular spins using the cross sections of the wire. The core domain is divided into four parts with right longitudinal spins and left longitudinal spins alternately.

When the external magnetic field is applied to reach magnetizing saturation from zero, the spin directions in domains are considered to change as bellow.

a) In the case of H=0, the spins of the core domain divided into four parts with same cross area are directed to right or left longitudinal directions alternately to make magnetization of M=0. The all spins of surface domain are directed perfectly to circular directions consistent with that of the anisotropy field in surface domain.

b) In the case of H<Hk/2, the core domains of same directional spins to the external filed direction extend and that of the reversal directional spins decrease so that the magnetization M=χH is produced to make the demagnetizing field and effective inner magnetic field Hin dependent on the demagnetizing factor. The spins in the surface domain is tilted toward the external magnetic field with the angle θ expressed as θ=πH/4Hm given by the equation (2).

c) In the case of H=Hk, all spins in the core domains are directed to the external filed direction so that the core domains are saturated. In the case of H=Hm, all spins in the surface domain is tilted toward the external magnetic field with the angle θ of 45 degree but the core domains are a little not saturated. Increasing from Hm to Hk, the core domains are saturated and the 90 degree wall between the surface domains and the core domains does not move. The measuring range of GSR sensor is defined as ±Hm.

d) In the case H is much bigger than Hk, the 90 degree walls reach to the top surface so that the surface domains vanish and the core domains cover whole cross section of the wire.

The discussion on essential conditions to make appearance of GSR effect which is a new electromagnetic phenomena is needed for developing the GSR sensor.

The basic conditions are to use the amorphous wire having the surface domain with the circular direction spin alignment and cause the spin rotation simultaneously by the pulse with high frequency of GHz order followed by detecting it by the micro coil.

GSR effect is caused by the rotation of spins in the surface domains due to pulse current with the frequency of over 0.5 GHz. The skin depth of the wire with the permeability of more than 3,000 is under 0.2 μm which is thinner than the thickness of the surface domain. But the numbers of spin rotated simultaneously in the skin depth decrease inversely proportional to $f^{1/2}$ so that it makes small change of the magnetization. However the coil voltage increase proportional to $f^{1/2}$ because it is proportional to the product of the frequency and spin numbers rotated.

On the contrary, MI effect is caused by the vibration of magnetization due to AC current with the optimum frequency of 10 MHz following vibration of 90 degree wall from top surface to the skin depth of about 1 μm to 4 μm dependent on the frequency and the permeability of the wire. The applied frequency is limited to under 200 MHz because 90 degree walls cannot move fast due to brake of eddy current and own inertial mass.

The wires used for realizing GSR effect are superior magnetic materials to have the anisotropy field of 1 G to 5 G, in other word the permeability of 3,000 to 20,000 and high resistivity of about 100 Ωcm based on the amorphous structure and the chemical composition of Co—Fe—Si—B possessing zero or small negative magneto-striction. In addition, the tension annealing or pulse annealing of the wire makes the circular anisotropy field Kθ and the longitudinal anisotropy field Ku to form the special domain structure consisting of the surface domain with circular spin alignment and the core domain with longitudinal spin alignment.

The thickness of the surface domain increases with increase of tension strength accompanied with low permeability. It is controlled within 0.2 μm under 1 μm.

GSR sensor is based on GSR effect which causes the spin rotation in the surface domain with circular spin alignment on the amorphous wire mentioned above excited by the pulse with the frequency of 0.5 GHz to 4 GHz and detects the change of longitudinal magnetization using the micro coil with the inner diameter of 15 μm and the coil pitch of 5 μm to output the coil voltage.

The coil voltage is detected as the pulse wave voltage with the frequency of 1 GHz which passes to a buffer circuit following a sample holding circuit consisting of an electric switch and a capacitance or directly a sample holding circuit with a capacitance with the very small capacity where the peak voltage of the pulse wave coil voltage is detected and is held in the capacitance using timing modulation circuit to control the electronic switch timing. The peak voltage pass to a programming amplifier which is amplified by designated degree to output it as the measured sensor voltage.

The external magnetic field is obtained from the sensor voltage by calculating the equation (2).

On the contrary, the coil type of MI sensor is based on MI effect which causes the vibration of longitudinal magnetization on the amorphous wire mentioned above excited by AC current with the optimum frequency of 200 MHz following vibration of 90 degree wall from top surface to the skin depth of about 1 μto 4 μm and detects the change of longitudinal magnetization using the plating coil with the inner diameter of 30 μm and the coil pitch of 30 μm to output the coil voltage.

The coil voltage detected as the pulse wave voltage with the frequency of 200 MHz passes to a sample holding circuit consisting of an electric switch and a capacitance where the pulse wave voltage is integrated from zero to the peak voltage using timing modulation circuit to control the electronic switch timing resulting to gain the voltage corresponding to the magnetization of ½M. The integrated voltage passes to a programming amplifier which is amplified by designated degree to output it as the measured sensor voltage. The external magnetic field is obtained from the sensor voltage using the equation as V∞χH within the linear relationship.

The differences between GSR senor and MI sensor are commented as below.

1) GSR sensor detects spin rotation of circular directional spin in surface domain excited by the pulse with the frequency of 1 GHz to 4 Gz. MI senor detects the vibration or rotation of the longitudinal magnetization caused by movement of the 90 degree wall excited by the pulse with the frequency of 0.2 GHz which is a low frequency compared to that used for GSR sensor.

2) GSR sensor is needed for the micro coil to detect the weak signal caused by spin rotation but the coil voltage increase proportional to the frequency $f^{1/2}$.

MI sensor is not so sensitive to the coil size in diameter and pitch or not needed for micro coil because it detects the big change of longitudinal magnetization caused by movement of 90 degree walls. But the coil voltage of MI sensor becomes small compared to that of GSR sensor because of the applied pulse frequency of 200 MHz. It is noticed the magnetic walls receive friction force caused by eddy current and cannot move fast.

3) The circuit of GSR sensor is to detect the peak coil voltage Vs directly using a buffer circuit and a sample holding circuit. The peak voltage is proportional to sin ($\pi/2 \cdot H/Hm$) and the measuring range is ±Hm.

The circuit of MI sensor is to detect the integration of the pulse wave coil voltage from zero to the peak voltage which corresponds to a half of the magnetization ½M proportional to $\chi H$. The magnetizing curve is not linear so that the measuring range given by the linear area is small about ±⅓Hm.

4) GSR sensor encounters the problem of parasitic capacitance of the pickup coil and induced voltage of wiring loop which increase proportional to the frequency and also the problem of IR drop of the coil where I is current induced in the coil, due to increase of the coil resistance R because of the micro coil. These problems are drawback of GSR sensor. GSR sensor has been achieved to develop new technology to solve these problems such as parasitic capacitance, induced loop voltage and IR drop problem.

The physical phenomena on GSR effect is discussed for understanding the characteristics of GSR effect which is characterized by dependence of the pulse frequency and sine functionality between the external field and the coil voltage given as the equation (2) within the external magnetic field of ±Hm.

FIG. 3A shows the relationship between the external magnetic field and the coil voltage obtained from experiments. The linear range is about ⅕Hm.

FIG. 3B shows the relationship between the external magnetic field and the converted coil voltage Vc given by the equation as Vc=arcsine (V/V0). The relationship has a linear range within the external magnetic field of ±Hm which means the measuring range extends from ⅕Hm to Hm.

GSR effect is caused by spin rotation in the surface domain with circular spin alignment forced by circular anisotropy field. This phenomena appear in the amorphous wire having two domain structure of the surface domain with circular spin alignment and the core domain with longitudinal spin alignment when the pulse with the frequency of 0.5 GHz to 4 GHz is applied to the wire and the skin depth is controlled under 1 μm by the anisotropy of under 8 G. It is observed by the micro coil surrounded around the wire.

The physical base of GSR phenomena is the spin-spin interaction which is very strong to produce the circular spin alignment and makes it possible to cause collective spin rotation simultaneously with ultra-high speed.

When the pulse frequency f increases, the skin depth decreases according to $f^{1/2}$ and the coil voltage increases proportional to $f^{1/2}$.

However the eddy current enlarged with increase of the frequency suppresses the rotation speed so that the coil voltage takes the maximum value at the specific frequency of about 1 GHz to 2 GHz. When the frequency is over the specific, precession of spin appears to decrease the coil voltage and finally reaching the spin resonance frequency, the coil voltage must become zero. Moreover high frequency pulse accompanied with eddy current heating makes the decrease of the permeability dependent on the temperature subsequent to the decrease of the coil voltage.

It is noted that the high frequency increases parasitic capacitance of the coil and makes big noise of the circuit and wiring. Therefore it is important to invent new technology for detecting GSR signal without induced coil voltage as noise voltage.

The concrete conditions needed for appearance of GSR effect are discussed for developing GSR sensor presented by this invention.

The magnetic wires applied are Co based amorphous alloy which have the magneto-striction of zero or small negative value, the anisotropy field of under 8 G, the specific permeability of over 1,000 and the wire diameter of under 20 μm. The thickness of the surface domain is controlled to more than skin depth which depends on specific resistivity and the permeability as well as the pulse frequency from under 1 μm by pulse annealing method or tension annealing treatment.

The pulse current applied is characterized by the current strength to produce the circular magnetic field of over 30 G, in other words, of over 1.5Hk and the pulse frequency of 0.5 GHz to 4 GHz with the pulse width tw of 1 nsec to 10 nsec and pulse periodic time of over 10×tw.

The size of GSR elements is characterized by the wire size with the diameter and the length and the coil size with the coil pitch and inner diameter. The wire diameter increases the coil voltage but should be limited up to 30 μm. Over 30 μm the surface domain with circular spin alignment cannot be formed. However it is desirable to take under 20 μm by consideration on how to produce micro coil.

The wire length increases the coil voltage contributing to improve the permeability due to small demagnetizing field and to increase the coil turn numbers proportional to the length. However it decreases measuring range, that is, there is a tradeoff relationship between the sensitivity and measuring range.

In the case to need both properties of wide range and high sensitivity, the element design of GSR sensor is recommended to take short wire length and fine coil pitch which produces a lot of coil turn numbers.

In the case to need ultra-high sensitivity, the element design of GSR sensor is recommended to take long wire length and a lot of coil turn numbers with fine coil pitch.

In order to make strong coupling between the spin rotation on the wire surface and the coil, the coil inner diameter is desirable under 25 μm or the gap of under 3 μm between the top surface of the wire and inner side of the coil. The coil pitch is desirable to be smaller than 10 μm to produce a lot of coil turn numbers.

The micro coil having the magnetic wire in the center position is produced by 3 dimensional photolithography technology on the substrate of which coil structure is characterized by the connection with lower side wiring formed on the groove with recessed shape and upper side wiring on protruding shape wall or including joint part connecting both wirings.

The process to produce the micro coil is as follows. First the Si substrate is formed to have the groove with the width of under 20 μm and the depth of under 10 μm on the surface. Secondly the lower side wiring is produced on the groove. Thirdly the magnetic wire is inserted into the groove following to glue it using adhesive resign. Fourthly the upper side wiring is produced on the protruding shape wall formed on adhesive resign or the magnetic wire and it is connected with the lower side wiring.

It is important to keep the insulation between the magnetic wire and the coil. If a glass coated wires or resign coated wires with insulating layer are used, it is easy to keep insulation with them. In the case the contact parts on the wire connecting with terminals are produced by cutting off the insulating layer and are wired to wire electrodes connected to the circuit. As other way, it is possible to use wires without insulating layer by means that insulating resin is put into the gap between coil and wire.

The high frequency increases parasitic capacitance of the coil and makes big noise of the circuit. Therefore it is important to develop new design of GSR element for decreasing parasitic capacitance of the coil. The induced coil voltages Vc is caused not only by parasitic capacitance of the coil but also wiring loop on the substrate of GSR element during period to flow the pulse current.

The induced coil voltage caused by parasitic capacitance of the coil is dependent on the direction of the pulse current and the coil voltage as signal related the external magnetic field is dependent on the helix direction of the coil. Therefore there are four types of the coil distinguished by output futures which are $R^+$, $R^-$, $L^+$, $L^-$ where R or L mean right or left turning coil respectively and signs of + or − mean the direction of the current which is same to plus or minus of the external magnetic field respectively.

The inventor found the proper combination called as GSR combination coil which can vanish the induced coil voltages and can add the signal coil voltages proportional to the external magnetic field.

The examples of the proper combinations are explained as bellow.

A GSR combination coil with two coils are given by the combination with same helix direction and reversal current direction expressed as $(R^++R^-)$ or $(L^++L^-)$ with two magnetic wires.

Another GSR combination coil with two coils are given by the combination with reversal helix direction and same current direction expressed as $(R^+-L^+)$ or $(R^--L^-)$ with one magnetic wire.

Two pairs types GSR combination coil with four coils are given by the combination with reversal helix direction and reversal current direction expressed as $(R^++R^-)-(L^++L^-)$ or $(R^+-L^+)+(R^--L^-)$ with two magnetic wires.

The induced coil voltage caused by the wiring loop on the substrate of GSR element can be vanished by means of proper wiring design. It must have symmetry designs and grade separations of wiring loops which make summation of flux passing through the wiring loops to zero. The wiring connecting with coil terminals and coil electrodes must prepare the grade separation with a wire connecting plus electrode to plus coil terminal and other wire connecting minus electrode to minus coil terminal.

The combination coil wiring expressed as $(R^+-L^+)$ or $(R^--L^-)$ is explained using the Example 4 shown in FIG. 9 drawing the top view.

The wire on the substrate of GSR element has two wire terminals of plus terminal and minus terminal which are connected by the plus wire electrode and minus wire electrode respectively. The current direction of plus is defined to be same to the external magnetic field direction of plus.

Each coil has two terminals of plus and minus and similarly a combination coil has two terminals of plus and minus. The wiring of the combination coil expressed as $(R^+-L^+)$ is made as bellow. Plus electrode is connected to plus terminal of combination coil which means plus terminal of $R^+$ coil following minus terminal of $R^+$ coil is connected to plus terminal of $L^+$ subsequently minus terminal of $L^+$ is connected to minus electrode. It is necessary that two connecting wires of plus coil electrode joining plus combination coil terminal and minus coil electrode joining minus combination coil terminal must prepare grade separation.

The combination coil of $(R^+-L^+)$ makes subtraction of both coil voltage provided by right turn coil and left turn coil dependent on the external magnetic field. It can add absolute value of the coil voltage because both coil voltages have opposite sign. But it also can cancel both induced coil voltages dependent on parasitic capacitance because both induced coil voltages have same sign and same absolute value.

The wiring loop on the substrate is formed by a grade separation and divided the loop cross section to two parts by the wire. Flux with same value but opposite sin pass through both sides of the loop and sum flux passing through the wiring loop to be zero so that the induced coil voltage by wiring loop is vanished.

By the way, similar wiring design is applied can be applied to the combination coil expressed as $(R^--L^-)$.

The combination coil wiring expressed as $(R^++R^-)$ or $(L^++L^-)$ which has two wires with same helix direction of the coil passing pulse current of opposite sign each other is explained using the Example 3 shown in FIG. 8 drawing the top view. The coil wiring of this combination coil is connected by the same way mentioned as Example 4.

The coil voltage is added by the wiring connection from plus coil electrode through plus terminal of $R^+$, minus terminal of $R^+$, plus terminal of $R^-$ minus terminal of $R^-$ to minus coil electrode with grade separation of two connecting wires of plus coil electrode joining plus combination coil terminal and minus coil electrode joining minus combination coil terminal.

The combination coil of $(R^++R^-)$ which makes addition of both coil voltage dependent on the external magnetic field. It can output the additional coil voltage of both right helix direction of the coil because both coil voltages have same sign. But it also can cancel both induced coil voltages dependent on parasitic capacitance of both coils produced by plus current and minus current respectively because both induced coil voltages have opposite sign.

The wiring loop consists of two loops formed by two grade separations which detect flux with same direction but both loops produce opposite sign voltage each other because two loop currents flow in the opposite direction so that the induced voltage by wiring loop can be vanished.

By the way, similar wiring design is applied can be applied to the combination coil expressed as $(L^++L^-)$.

The combination coil wiring expressed as $(R^++R^-)-(L^++L^-)$ which has two wire respectively with right turn coil and left turn coil passing pulse/minus current of opposite sign each other is explained using the Example 1 shown in FIG. 5 drawing the top view. The coil wiring of this combination coil is connected by the same way mentioned as Example 4.

The coil voltage is added by the wiring connection from plus coil electrode through plus terminal of $R^+$, minus terminal of $R^+$, plus terminal of $R^-$ minus terminal of $R^-$, plus terminal of $L^+$, minus terminal of $L^+$, plus terminal of $L^-$, minus terminal of $L^-$ to minus coil electrode with two grade separation. One is formed by two connecting wire of from plus coil electrode to plus combination coil terminal and from minus coil electrode to minus combination coil terminal. Other is formed by two connecting wire of from plus terminal of $R^+$ to minus terminal of $R^+$ and from minus terminal of $L^+$ to plus terminal of $L^-$.

The combination coil of $(R^+ + R^-) - (L^+ + L^-)$ which makes addition of four coil voltages can output the additional coil voltage dependent on the external magnetic field. But it also can cancel four induced coil voltages dependent on parasitic capacitance.

The wiring loop consists of two loops formed symmetrically by two grade separations which detects flux with same direction and same value produced by the pulse current but makes opposite sign voltage because two loop currents flow in the opposite direction each other so that the induced voltage by wiring loop can be vanished.

By the way, similar wiring design is applied can be applied to the combination coil expressed as $(R^+ - L^+) + (R^- - L^-)$.

On producing the coils and the wiring mentioned above, the distortion from symmetrical structures generates residence $\Delta Vc$ of the induced coil voltage. In this case, it is desirable to obtain the true coil voltage Vs by subtracting the induced coil voltage Vc measured at Hex=0 from the measured coil voltage Vm using calculation program or operation circuit. That is Vs=Vm−Vc.

When residence $\Delta Vc$ of the induced coil voltage Vc measured at Hex=0 is not negligible compared to the maximum output voltage ½·E max of operation amplifier, the sensitivity of GSR sensor decrease dependent on the residence $\Delta Vc$ because effective voltage of ½·E max decreases to ½Emax−$\Delta Vc$. As example, when ½·E max=1V, $\Delta Vc$=0.5V, at the worst case, the output of GSR sensor decreases from 1V to 0.5V which means the sensitivity makes decreases of 50%.

The other reason why it is important to vanish or decrease the induced coil voltage is explained. The coil voltage is induced a little later than the induced coil voltage because the induced coil voltage is induced with synchronization to the circular magnetic field but the coil voltage is induced with synchronization to spin rotation moving behind the circular magnetic field because eddy current makes braking force.

The external magnetic field is measured from the peak coil voltage of the coil wave voltage which is detected by electronic switch. The switch works from on to off at the timing of the peak voltage. Even if temperature deviation causes time deviation of the switch detection timing thorough the deviation of resister and capacitance, the top of the peak is so flat that influence of temperature in the coil voltage is small or negligible. If GSR sensor with combination coil vanishes the induced coil voltage, it must provide good temperature dependence. Example 1 mentioned bellow can provide origin temperature drift of 0.02 mG per degree after corrected by the temperature correction program.

However if the induced coil voltage wave remains, its detection timing is delayed from the peak point of the induced coil voltage and it is at the sharp slope of the induced coil voltage which makes bad temperature dependence. So that it is desirable to vanish the induced coil voltage.

The circuit of GSR sensor is discussed as bellow.

The circuit of GSR sensor is to detect the peak voltage Vs of the pulse wave coil voltage Vp directly using a buffer circuit following a sample holding circuit with a capacitance to hold the peak coil voltage after switching off an electric switch controlled by timing modulation circuit. The peak voltage passes to a programming amplifier which is amplified by designated degree to output it as the measured sensor voltage.

The external magnetic field is obtained from the peak voltage Vs using the equation as Vs∝ sin($\pi/2 \cdot H/Hm$). The measuring range becomes ±Hm by using this equation.

GSR sensor encounters the problem on parasitic capacitance of the coil and induced voltage of wiring loop which increase proportional to the frequency. It also encounters the problem on IR drop of the micro coil which is accompanied with increase of the coil resistance. These problems are drawback of GSR sensor. GSR sensor has been achieved to invent new element designs to eliminate parasitic capacitance and induced loop voltage as well as the new circuit design to solve IR drop problem.

The micro coil of GSR element can prepare a lot of coil turn numbers easily but it is accompanied with big resistance compared to current MI element. The circuit design expressed in patent literature 7 which has a buffer circuit before a sample holding circuit is serviced so that IR drop problem can be solved.

The temperature dependence of the peak coil voltage Vp is dependent on that of anisotropy field and circular magnetization caused by spins with tilt angle of θ.

Co-Fe ally has high Curie temperature close to 1422 degree K so that it can provide temperature stability of circular magnetization at room temperature. The amorphous wire is tension annealed at the temperature of 800 degree K so that it can provide temperature stability of anisotropy field at room temperature.

The mass of spins aligned to circular direction in the surface domain are perfectly lined up in a row by strong spin-spin interaction at room temperature far below Co Curie temperature of 1422 degree K and are restricted to circular direction by circular anisotropy field produced by tension annealing of 800 degree K. At room temperature, mass of spins can rotate simultaneously during short period of under 1 nsec keeping with perfect lineup, which means the spin rotation produce almost no thermal noise.

The theoretical analysis results that the thermal noise of GSR element is estimated about 0.01 pT where pT=10 nG. In other words, the temperature of spin system of the wire is nearly absolute zero. So it is noted that GSR sensor has potentiality equal to SQID sensor based on magnetic flux quantization. On the contrary, MI effect is based on vibration of the 90 degree wall accompanied with big thermal noise due to thermal vibration of the lattice caused by resistance power against movement of the wall.

Effect of Invention

GSR sensor can achieve excellent performance 100 times higher than that of commercial MI sensor which is estimated by comprehensive index estimated with sensitivity, measuring range, measuring cycle time, hysteresis, linearity, temperature dependence, size and current consumption.

GSR sensor is expected to contribute in developing indoor navigation, wearable computer, medical equipment and so on.

BRIEF DESCRIPTION OF DRAWINGS

FIG. 1A is the schematic view of the magnetizing curve for the longitudinal external magnetic field.

FIG. 1B is the schematic view of the relationship between the coil voltage and the longitudinal external magnetic field.

FIG. 3A is the schematic view of the relationship between the external magnetic field and the coil voltage.

FIG. 3B is the schematic view of the relationship between the external magnetic field and the converted coil voltage.

FIG. 6A is the schematic top view of GSR element.

FIG. 6B is the schematic cross section view of the coil of GSR element.

FIG. 6C is the schematic cross section view of the electrode of GSR element.

DESCRIPTION OF EMBODIMENTS

Figure 1A:
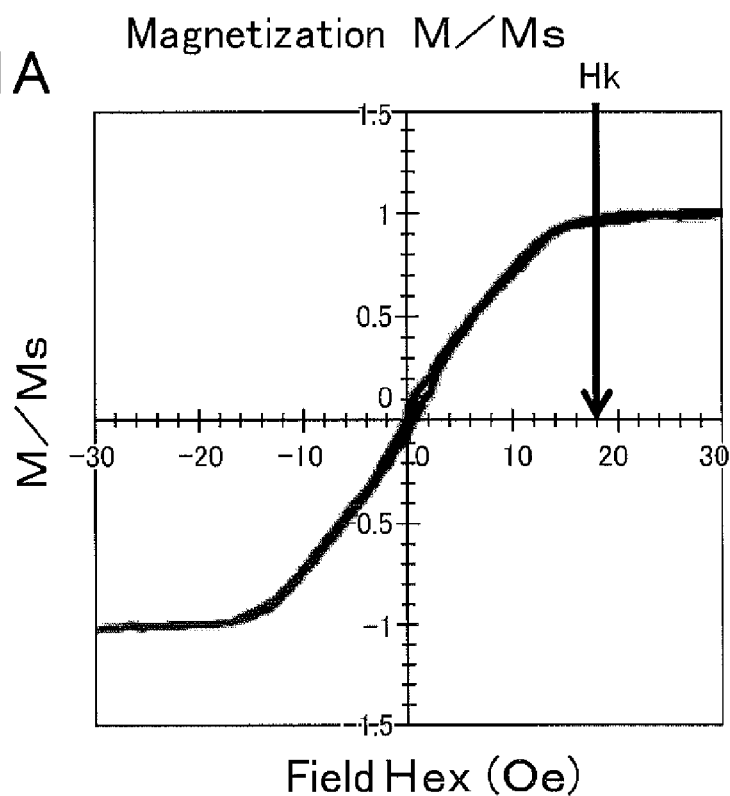
FIGS. 1A and 1B are schematic view of the magnetizing curve of the amorphous magnetic wire.
Figure 1B:
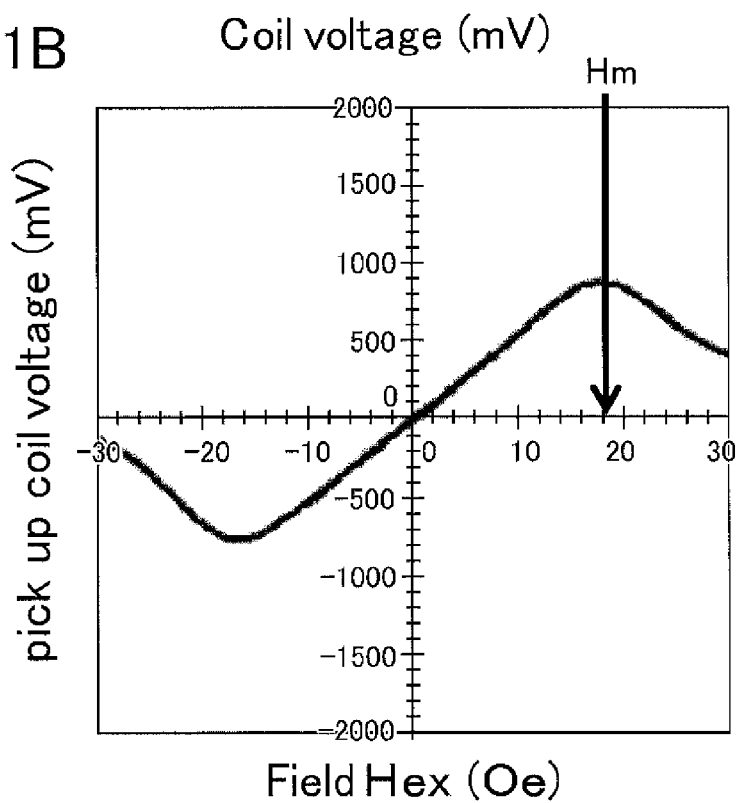
Figure 2:
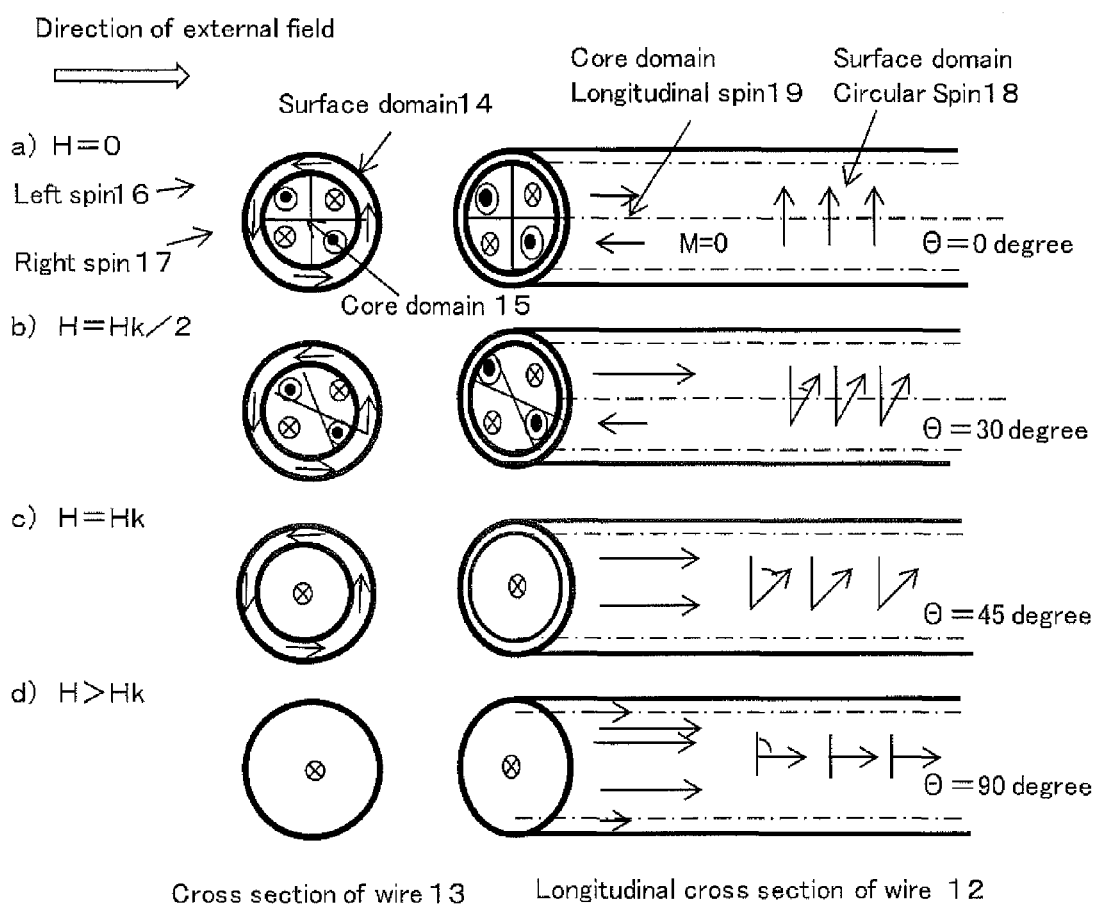
FIG. 2 is a schematic view of the change of the magnetic domains of the amorphous wire by increase of the external magnetic field. a) H=0, b) H=Hk/2, c) H=Hk, d)H>Hm
Figure 3A:
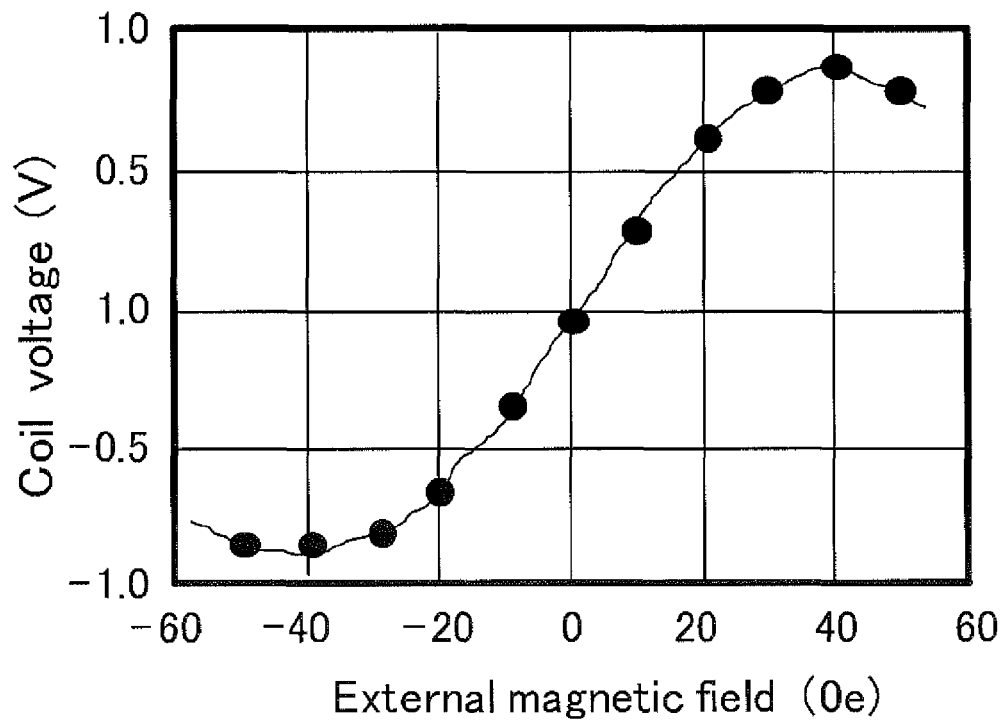
FIGS. 3A and 3B are schematic view of the effect of the external magnetic field on the coil voltage for Example 1.
Figure 3B:
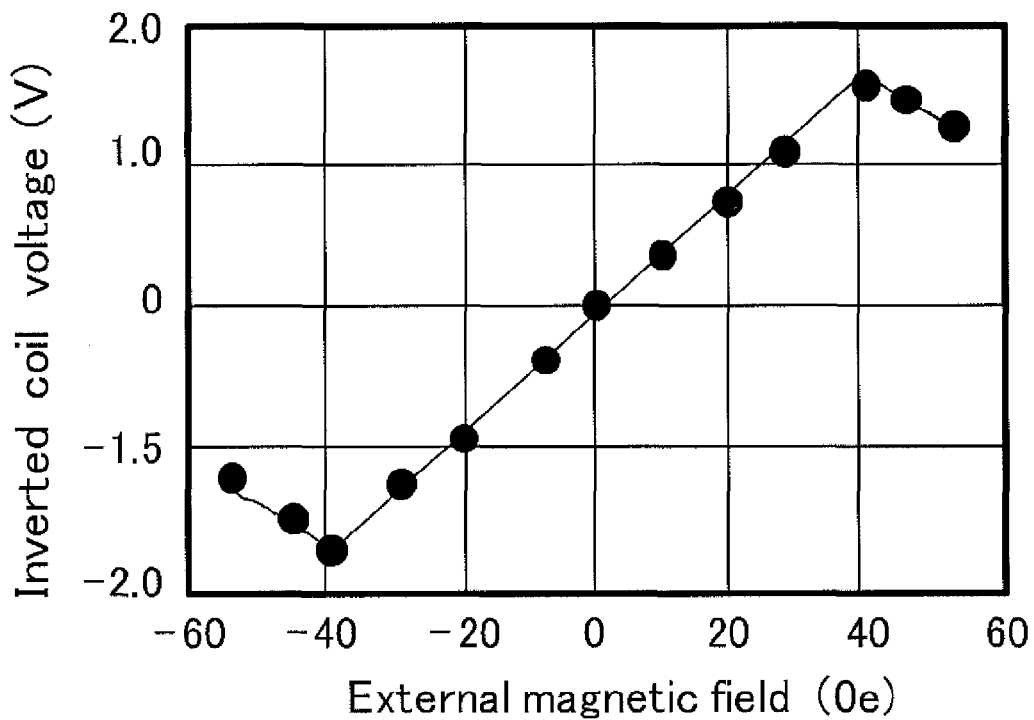
Figure 4:
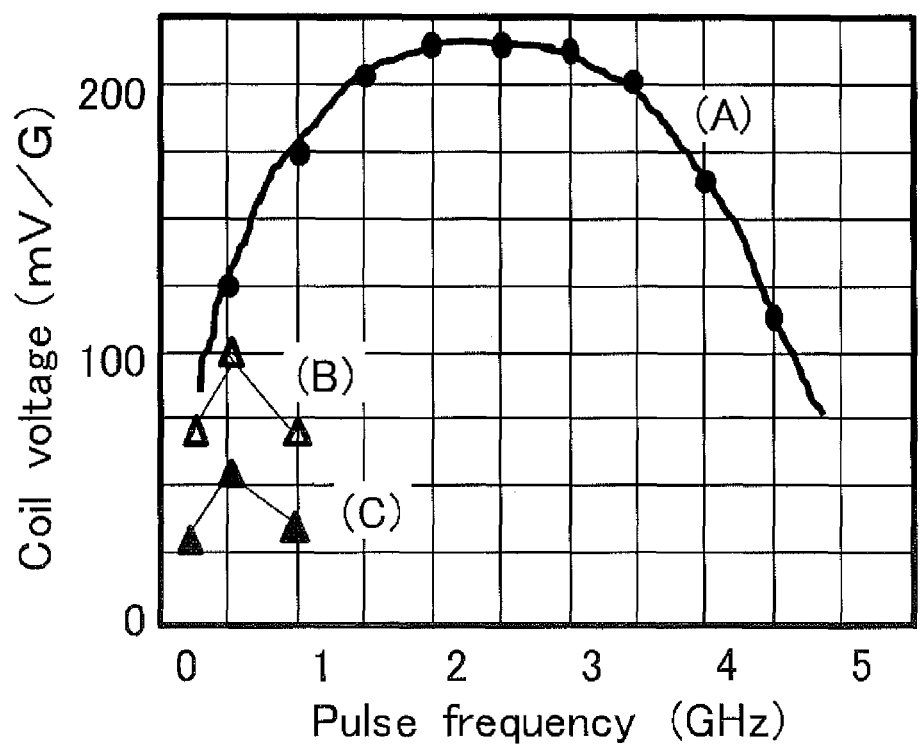
FIG. 4. is a schematic view of the effect of the pulse frequency on the coil voltage for Example 1.

The optimum embodiments of the present invention on GSR sensor based on spin rotation effect caused by the pulse current with GHz frequency is explained as bellow. The first embodiment of the present invention is applied mainly to electronics compass detecting the earth magnetic field of 0.5 G used for smartphone or wearable computer.

The embodiment is expected to provide the excellent performance and small size with the length of under 0.4 mm and width of under 0.2 mm.

The sensor performance requested for electronics compass are noise of under 1 mG, measuring range of over ±20 G, sensitivity of under 1 mG/bit, measurement interval of under 1 msec,and current consumption of about 0.2 mA. The above performance is far better than that of conventional MI sensor used for electronics compass which has 2 mG, ±12 G, 1.5 mG/bit, 5 msec, 0.4 mA respectively.

GSR sensor consists of a GSR element and a circuit detecting the coil voltage. The coil voltage measured is converted to the external magnetic field using the equation (2). GSR element consists of wires, pickup coils, electrodes and wirings on the substrate. The circuit consists of a pulse generator, a GSR element, a buffer circuit, a sample holding circuit, a detection timing modification circuit and a programming amplifier.

The magnetic wire used is an amorphous wire of CoFeSiB alloy with the diameter of 3 μm to 10 μm coated with the glass of under 1 μm thickness. The amorphous structure is desirable but the nanocrystal structure is available. The magnetic properties are characterized by the anisotropy field of under 10 G, the magneto-striction of zero or minus small value, the permeability of 1000 to 100,000 and the specific resistivity of over 80 μΩcm.

The wire is needed to be insulated against the coil by coating the wire with glass or resign. Another way to hold the insulation is to inset insulating material into the gap between the wire and the coil but this way is apt to produce the bigger gap between coil and wire than that to use coated wire. So this way in not favorable.

The high permeability of the magnetic wire which corresponds to low anisotropy field can improve the sensitivity of GSR sensor proportional to the coil voltage but makes the measuring range to be narrow.

The micro coil used for the invention can solve the tradeoff problem between the sensitivity and measuring range. The micro coil is produced with narrow coil pith of under 10 μm improved from 30 μm of coil pitch of MI sensor. It can increase coil numbers regardless of short length of the wire and can improve the sensitivity.

When the wire of the micro coil prepares the length of under 0.20 mm, the output can provide the measuring range of over ±30 G. On the contrary, the plating coil type MI sensor has the wire length of 0.6 mm to make the measuring range of ±12 G.

The wire has a particular structure which consists of the core domain with longitudinal spin alignment and the surface domain with circular spin alignment. This structure is formed by longitudinal anisotropy field Ku and circular anisotropy field Kθ produced by tension annealing. The thickness of the surface domain is proportional to Kθ. The more thickness, the less sensitivity. So that it is desirable to prepare that of 0.1 μm to 1 μm.

For pulse current causes spin rotation of the surface domain massively, strength of pulse current is needed over 50 mA to produce the circular magnetic field Hθ of more than 1.5 Hm around the wire. The strength of circular magnetic field Hθ is enlarged according to anisotropy field Kθ of the wire but an unreasonable big pulse current should not be used because it causes heating and increase of the current consumption. In the present embodiment, the suitable range of the pulse current and circular magnetic field are 100 mA to 200 mA and 40 G to 80 G respectively.

The effect of the frequency on the coil voltage is characterized as below.

At the frequency of 0.5 GHz to 1 GHz the coil voltage increases with the frequency proportional to $f^{1/2}$ and then at 1 GHz to 2 GHz it has peak voltage. But at 2 GHz to 4 GHz, it decreases gradually and at over 4 GHz it drops drastically because the precession appears or strong eddy current produce heating on the surface. It is concluded that the pulse frequency applied are suitable within 0.5 GHz to 4 GHz.

The optimum range of frequency is from 1 GHz to 3 GHz. It makes skin depth of 0.05 μm to 0.5 μm. Thickness of the surface domain controlled by anisotropy field Kθ should be enlarged than the skin depth. The pulse width of more than 1 nsec is needed. The range are suitable with over 5 nsec to 10 nsec which can avoid the interference between both coil wave voltages, that is, rising pulse and falling pulse.

The coil voltage is caused by circular magnetic field of over 60 G produced by pulse current passing through the wire. The circular magnetic field is reversal proportional to the diameter D of the wire. For decreasing the pulse current, it is desirable the diameter should become smaller as far as possible. The diameter should be at least under 20 μm for forming the surface domain with circular spin alignment. The diameter of over 20 μm cannot form the specified structure. Moreover making the micro coil, the small diameter is better in production. But the coil voltage is proportional to the diameter so that too small diameter is not good. It is resulted that the diameter is suitable for 5 μm to 12 μm.

The wire length influences in the coil voltage and measuring range Hm which are restricted by tradeoff relationship. Wider measuring range can be obtained by shorter wire. Higher coil voltage can be obtained by longer wire. So the suitable range of the wire length is recommended to 0.1 mm to 0.5 mm for electronics compass application. The invention can provide the noise of under 1 mG and measuring range of over ±30 G under the wire length of 0.2 mm and micro coil with coil pitch of 5 μm.

The micro coil with the coil pitch of under 10 μm is produced using 3 dimensional photolithography. The process is to produce at first a groove with width of under 20 μm and depth of 7 μm on the Si substrate, secondary a lower side coil pattern on the groove. Thirdly the wire coated by insulating material is inserted into the groove following fixed using adhesive and finally a upper side coil pattern is made on the wire. Subsequently the terminal on the wire is prepared by stripping off the coating material and it is connected to wire electrodes by conductive wire produced using sputtering equipment.

The smaller in the coil pitch, the better for increasing coil turn numbers. But considering the difficulty to produce the ultra-micro coil, the suitable range of the coil pitch must be from 1 μm to 6 μm.

The GSR element design is important to vanish the induced coil voltage which increases with increase of the pulse frequency. The main sources of the induced coil voltages are the parasitic capacitance of the coil and the wiring loop formed by combination coil wiring.

Figure 8:
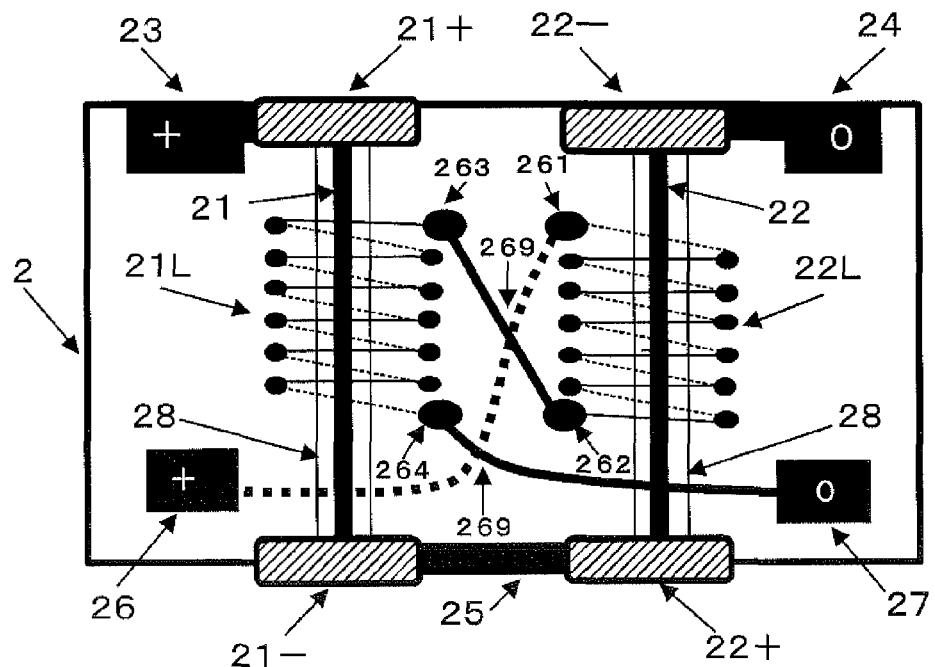
FIG. 8 is a schematic top view of GSR element introduced as Example 3.

As shown in FIG. 8 the combination coil of the present embodiment has two wires binding right turn coil each other passing the pulse current through two wires with opposite directions. This combination coil is expressed as $R^+ + R^-$.

The signal voltage proportional to the external magnetic field is added because of same sig. But the induced coil voltage caused by the parasitic capacitance is cancelled because of opposite sign.

As for wiring loop design, two loops are formed by two grade separation which detects the magnetic field with same sign produced by the pulse current. But two voltages is added with opposite current directions of the loop each other. If the loops have same area with a line symmetry, the induced coil voltages in two loops are cancelled to vanish. But it is hard to produce two loops with perfect equal area using this combination coil wiring design.

Figure 5:
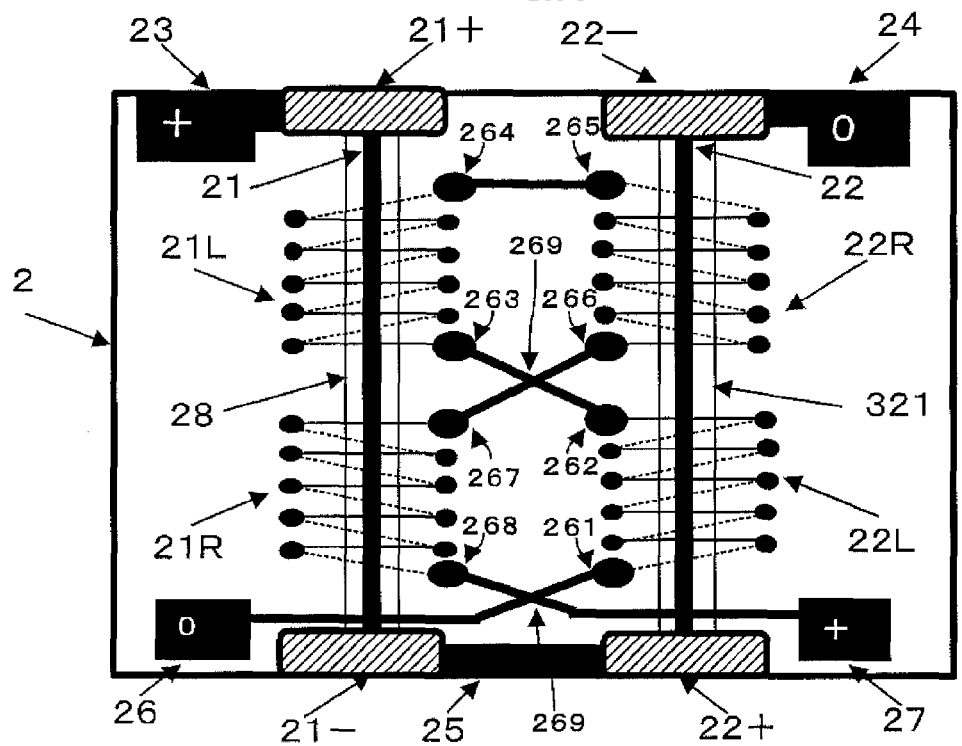
FIG. 5. is a schematic top view of GSR element introduced as Example 1.

FIG. 5 shows another combination coil of the present embodiment has two wire binding both of a right turn coil and a left turn coil each other passing the pulse through two wires with opposite direction. This combination coil is expressed as $(R^+ + R^-) - (L^+ + L^-)^-$. The above discussion makes clear that both combination coils expressed as $(R^+ + R^-)$ and $(L^+ + L^-)$ provide addition for signal voltage proportional to the external magnetic field because of same sign and subtraction for the induced coil voltage by the parasitic capacitance of opposite sign. Subtracting the coil voltage of $(L^+ + L^-)$ from that of $(R^+ + R^-)$, the combination coil voltage as $(R^+ + R^-) - (L^+ + L^-)$ gives addition of four signal coil voltages.

As for wiring loop design, two loops are formed by two grade separation which detects the magnetic field with same sign produced by the pulse current. But two induced voltages are added with opposite current directions of the loop each other. If the loops have same area with a line symmetry, the induced coil voltages in two loops are cancelled to vanish. Moreover this combination coil wiring design is easy to make two loops with equal area.

The distortion from symmetrical structures on producing the coils and the wiring mentioned above make residence $\Delta Vc$ of the induced coil voltage. In this case, it is desirable to obtain the true coil voltage Vs by subtracting the induced coil voltage Ye measured at Hex=0 from the measured coil voltage Vm using calculation program or operation circuit. When residence $\Delta Vc$ of the induced coil voltage Vc measured at Hex=0 is not negligible compared to the maximum output voltage ½·E max of operation amplifier, the sensitivity of GSR sensor decrease dependent on the residence $\Delta Vc$. Because effective voltage of ½·E max decreases to ½Emax–$\Delta Vc$. As example, when ½·E max=1V, $\Delta Vc$=0.5V, at the worst case, the output of GSR sensor decreases from 1V to 0.5V which means the sensitivity makes decreases of 50%.

The other reason why it is important to vanish or decrease the induced coil voltage is explained. The coil voltage is induced a little later than the induced coil voltage because the induced coil voltage is induced with synchronization to the circular magnetic field but the coil voltage is induced with synchronization to spin rotation moving behind the circular magnetic field because eddy current makes braking force.

The peak coil voltage is detected at the timing when the external magnetic field gives the most sensitive effect to the coil voltage. Even if the temperature affects circuit to shift the detection timing, the influence in the coil voltage is small because the top of the peak is flat against time deviation. GSR sensor with combination coil to vanish the induced coil voltage has good temperature dependence on origin drift of 0.02 mG per degree corrected by using the temperature measured by the temperature sensor equipped inside of the sensor circuit.

However if the induced coil voltage wave remains, its detection timing is delayed from the peak point of the induced coil voltage and it is detected at the sharp slope which makes bad temperature dependence. So that it is desirable to vanish the induced coil voltage.

The present embodiment provide the performance mentioned above under the numbers of the coil turn numbers of over 20 and the resistance of over 10 Ω however it can provide suitable performance within the coil turn numbers of 40 to 100 and the coil resistance of 100 Ω to 400 Ω. The wire resistance of 4 Ω to 40 Ω is suitable.

Figure 10:
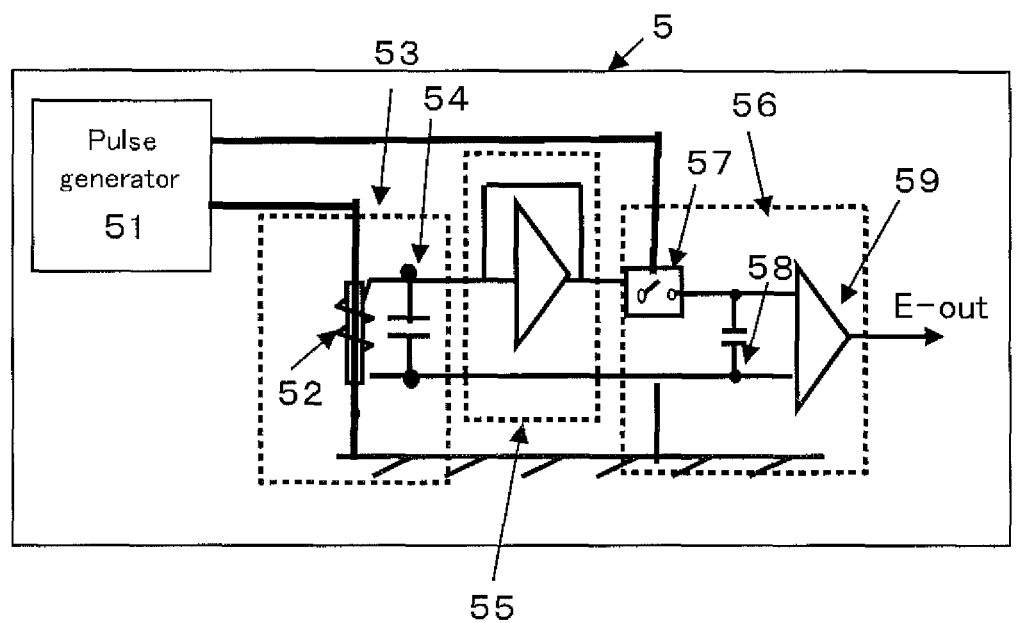
FIG. 10 is a schematic of the circuit applied to examples.

The outputs of the present embodiments are measured by the GSR sensor circuit having a buffer circuit 55 shown in FIG. 10. It is resulted that the designated output voltages are obtained. As for connection with GSR elements and ASIC (integrated circuit) of GSR sensor, electrodes of elements are soldered to electrodes of ASIC directly.

The circuit 5 shown in FIG. 10 consists of a pulse generator 51, a GSR element 52, a buffer circuit 55, a sample holding circuit 56, a programming amplifier 59 and an AD converter and a digital circuit for signal processing.

The pulse generator 51 generates the pulse current with the pulse frequency of 2 GHz passing through the wire of GSR element 52 and the coil of the element detects the coil wave voltage transferring to the buffer circuit 55 following the sample holding circuit 56 to hold the peak voltage in the capacitance 58 which corresponds to the external magnetic field.

The buffer circuit 55 suppress the pulse current through the coil to nearly zero so that IR drop voltage becomes negligible level even if the resistance is large.

The peak voltage is inverted to digital signal within 8 bit to 16 bit by an analog digital converter ADC transferring to a digital circuit where it converts the value of the external magnetic field and output to outside processors. The digital circuit equips a memory to hold the measured data, calibrate program and initial numerical values.

The embodiments provide the excellent performance and small size with the length of under 0.4 mm and width of under 0.4 mm. The performance achieved are noise of 0.05 mG to 1 mG, measuring range of ±20 G to ±60 G, sensitivity of under 1 mG/bit, measurement interval of 1 msec, and consumption current of about 0.2 mA. The above performance is better than that of conventional MI sensor used for electronics compass which are 2 mG, ±12 G, 1.5 mG/bit, 5 msec, and 0.4 mA respectively.

The present embodiments used for the electronics compass can improve the performance index S of over 100 times better than that of conventional MI sensor used in the commercial electronics compass.

The second embodiment of the present invention is applied to pT sensor detecting the bio magnetism of 1 pT level used for Magnetocardiography or magnetoencephalogram.

The second embodiments prepare same design and basic parameter same to the first embodiments. However the wire length is 1 mm to 5 mm to increase the coil voltage and the sensitivity of the present embodiments. The size of the elements are length of 1 mm to 5 mm, width of 0.6 mm to 1.8 mm. The coil turn numbers are increased by 300 to 2000 to make detection of the ultra-small bio magnetism possible. The structure of the element consists of single or plural combination coil with combination of right turn coil and left turn coil. It is desirable to control the resistance of the combination coil from 500 Ω to 2 kΩ and the wire resistance from 20 Ω to 40 kΩ.

The embodiments provide the excellent performance characterized by noise of 1 pT to 100 pT, measuring range of under ±30 mT, sensitivity of 0.1 pT/bit to 1 pT/bit, measurement interval of 1 msec to 10 msec, the linearity of under ±1% and current consumption of about 10 mA. The above performance is better than that of conventional MI sensor used for electronics compass which are 2 mG, ±12 G, 1.5 mG/bit, 5 msec, 0.4 mA respectively. The present embodiments used for the bio magnetism sensor can provide the noise of 1 pT 1000 times better than that of 1 nT (where nT =10 μG) achieved by a commercial nT sensor based on MI sensor.

The third embodiment of the present invention is applied to industrial use such as home appliance, automotive, Robot and so on detecting the signal magnetic field of 10 G to 300 G emitted by magnets attached into the artificial system. This embodiments are characterized by the wide measuring range of over ±100 G given by the design with the wire length of under 0.1 mm, the coil pitch of 2 μm to 6 μm, and the coil turn numbers of 15 to 50. The detail performance of the embodiments such as noise, measuring range, measuring cycle, power consumption sensor size and so on are designed with the main factors of GSR sensor optimized according to applications.

As shown in FIG. 8 the combination coil of the present embodiment has two wire binding right turn coil each other passing the pulse through two wires with opposite direction. The combination coil is expressed as $R^+ + R^-$. The signal voltage proportional to the external magnetic field is added because of same sign and the induced coil voltage by the parasitic capacitance is cancelled because of opposite sign.

As for wiring loop design, two loops are formed by two grade separations which detect the magnetic field with same sign produced by the pulse current. But two induced voltages are added with opposite current directions of the loop each other. If the loops have same area with a line symmetry, the induced coil voltages in two loops are cancelled to vanish.

The fourth embodiment of the present invention is applied to electronics compass detecting the earth magnetic field of 0.5 mG used for a catheter, a gastro scope and an endoscope characterized by ultra-small size and high sensitivity which are achieved by the design with the wire diameter of under 5 μm, the wire length of under 0.02 mm, the coil pitch of under 1 μm, and the coil turn numbers of 10 to 20.

Every type of combination coil designs can be used for this embodiment, but one wire type might be suitable to make element size small because of the simple structure.

Figure 9:
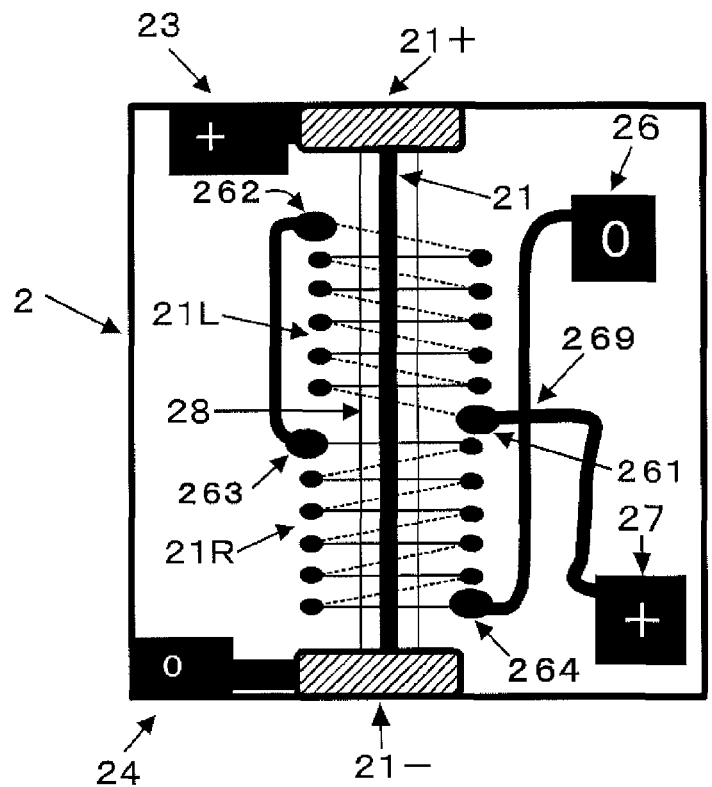
FIG. 9 is a schematic top view of GSR element introduced as Example 4.

The combination coil wiring expressed as $(R^+-L^+)$ or $(R^--L^-)$ is explained using the Example 4 shown in FIG. 9 drawing the top view.

The wire on the GSR element substrate has two terminals of plus terminal and minus terminal which are connected by the plus wire electrode and minus wire electrode respectively. The current direction of plus is defined to be same to the external magnetic field direction of plus which is base direction. Each coil has two terminals of plus and minus and similarly a combination coil has two terminals of plus and minus. The wiring of the combination coil expressed as $(R^+-L^+)$ is made as bellow.

Plus coil electrode is connected to plus terminal of combination coil which means plus terminal of $R^+$ coil following minus terminal of $R^+$ coil is connected to plus terminal of $L^+$ subsequently minus terminal of $L^+$ is connected to minus coil electrode. It is necessary that two connecting wires of plus coil electrode joining plus combination coil terminal and minus coil electrode joining minus combination coil terminal must prepare grade separation.

The combination coil of $(R^+-L^+)$ which makes subtraction of both coil voltage can output the additional coil voltage of right turn coil and left turn coil, dependent on the external magnetic field, because both coil voltages have opposite sign. It also can cancel both induced coil voltages dependent on parasitic capacitance of both coils produced by plus current because both induced coil voltages have same sign.

The wiring loop on the element substrate is formed by a grade separation and divided to cross section by the wire. Both side crosses can catch flux with same strength but opposite sign to achieve zero summation of flux passing through the wiring loop so that the induced coil voltage by wiring loop is vanished.

By the way, similar wiring design is applied can be applied to the combination coil expressed as $(R^--L^-)$.

The fifth embodiment of the present invention is applied to magnetic imaging applications detecting the earth magnetic field of 0.5 mG used for a magnetic microscope, a magnetic camera, a paper money detection and so on. This embodiments are characterized by ultra-high measuring speed of 10 MHz to 100 MGz and low noise of under 1 mG as well as its small size. The embodiments equip the arrayed GSR elements controlled by high speed switch.

As mentioned above using five embodiments, the present sensors are used for many applications by making a lot of designs according to the applications which request very different specifications such as the noise of from 100 nT to 1 pT, measuring range of ±0.1 mT to ±30 mT, measuring speed of 20 Hz to 100 MHz and elements length of 0.02 mm to 2 mm. One of advantages of the present invention is to make possible many designs according to many applications.

EXAMPLES

Example 1

The first example according to the first embodiment of the present invention is applied to electronics compass detecting the earth magnetic field of 0.5 mG used for smartphone or wearable computer. The example provide the excellent performance and the small size with the length of 0.2 mm and width of 0.2 mm. The performance are noise of 0.2 mG, measuring range of ±50 G, sensitivity of 0.2 mG/bit, measurement interval of 1 msec, and current consumption of 0.1 mA. The above performance is better than that of conventional MI sensor used for electronics compass which are 2 mG, ±12 G, 1.5 mG/bit, 5 msec, 0.4 mA respectively. GSR sensor consists of the GSR element and the circuit detecting the coil voltage and measures the external magnetic field converted from the coil voltage using the equation (1).

The GSR element consists of the wire, pickup coil, electrodes and wiring on the substrate. The circuit consists of a pulse generator, an element, a buffer circuit, a sample holding circuit, a detect timing modification circuit and a programming amplifier.

The top view of GSR element used in the first example is shown in FIG. 5. It is a combination coil expressed as $(R^++R^-)-(L^++L^-)$ which has two wire 21, 22 respectively with right turn coil 21R, 22R and left turn coil 21L, 22L passing pulse current of opposite sign with each other. The detail structure of the element 2 is explained by the top view and cross section view of the single element shown in FIG. 6.

The magnetic wire used is an amorphous wire of CoFeSiB alloy with the diameter of 10 μm coated with the glass of 1 μm thickness. The amorphous structure is desirable but the nanocrystal structure is available. The magnetic properties are characterized by the anisotropy field of under 5 G, the magneto-striction of $10^{-6}$, the permeability of 10,000 and the specific resistivity of 100 μΩcm.

The wire is insulated against the coil by coating the wire with glass. The wire has a particular domain structure which consists of the core domain with longitudinal spin alignment and the surface domain with circular spin alignment. This structure is formed by longitudinal anisotropy field Ku and circular anisotropy field Kθ produced by tension annealing.

The thickness of the surface domain increases to result the decrease of the sensitivity because the thickness is proportional to Kθ. So that it is desirable for under 1 μm. The strength of pulse current is 200 mA to produce the circular magnetic field Hθ of 60 G on the wire surface so that it causes spin rotation of the surface domain massively. The width of the pulse is 5 msec to make pulse annealing to the wire for vanishing the core domain as well as magnetic hysteresis by means that the 90 degree magnetic wall moves from surface to the center to produce vortex structure.

The frequency of 2 GHz is used to make the skin depth of 0.12 μm which is below the thickness of the surface core of about 0.5 μm. The amorphous wire has the diameter of 10 μm and the length of 0.2 mm which makes the measuring range Hm of ±40 G.

The coil turn numbers is 48 turns and the coil pitch is 5 μm.

Figure 6A:
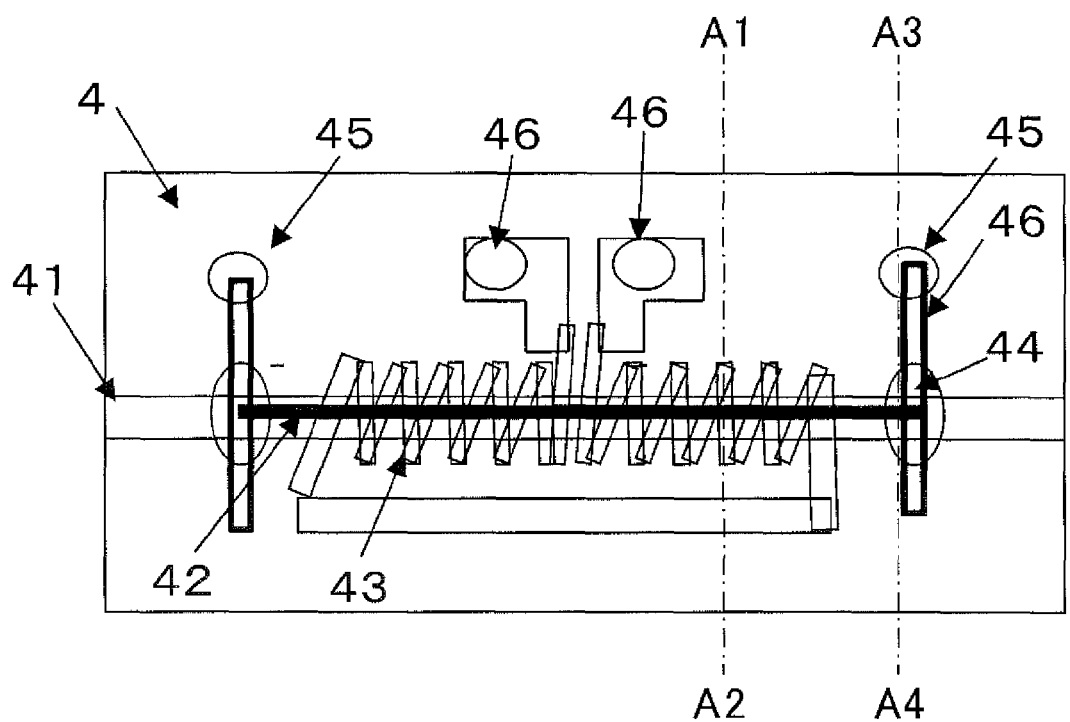
FIGS. 6A, 6B, and 6C are schematic cross section view of GSR element introduced as Example 1.
Figure 6B:
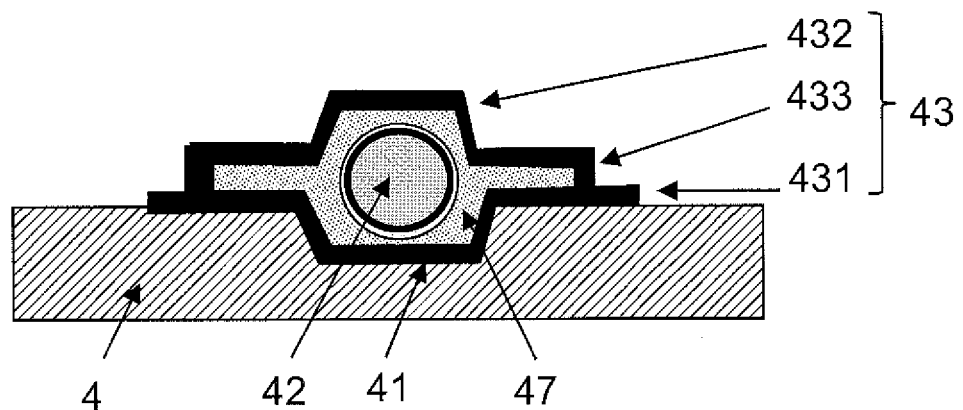
Figure 6C:
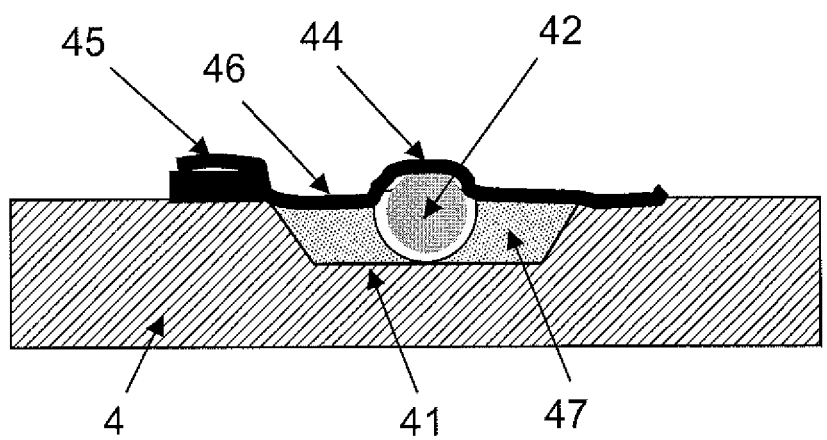

The cross section of the coil 43 shown in FIG. 6 consists of the magnetic wire 42 with glass coating positioned on the coil center fixed by adhesive resign 47, Si substrate 4 with the groove 41, the lower side coil 431 wiring on the groove 41, the upper side coil 432 wiring on the magnetic wire 42 and the step joint part 433 with both coil wirings.

The wire 42 is fixed inside the groove 41 by the adhesive resign 47 and the insulation with the coil and the wire is kept by the glass coating on the wire. The wire terminals 44 which are formed by removal of the glass are connected to the wire electrodes 45 with joint part 46 produced by metal vaporing.

As for the wire wiring of the combination coil shown in FIG. 5, the pulse current pass through the wires with opposite direction with each other by the connection from the plus wire electrode 23 through wire connection part 25, plus terminal 21+ of left hand wire 21, minus terminal 21− of it, plus terminal 22+ of right hand wire 22, minus terminal 22− of it to the grand wire electrode 24. As for the coil wiring, the coil voltage is added by the wiring connection from plus coil electrode 26 through plus terminal 261 of $L^-22L$, minus terminal 262 of $L^-22L$, plus terminal 263 of $L^+21L$, minus terminal 264 of $L^+21L$, plus terminal 265 of $R^-22R$, minus terminal 266 of $R^-22R$, plus terminal 267 of $R^+21R$, minus terminal 268 of $R^{++}21R$ to grand coil electrode 27 with grade separation 269 of two connecting wires of plus electrode 26 joining plus combination coil terminal and grand coil electrode 27 joining minus combination coil terminal.

This combination coil is expressed as $(R^++R^-)-(L^++L^-)$. The above discussion makes clear that both combination coils expressed as $(R^++R^-)$ and $(L^++L^-)$ provide addition for signal voltage proportional to the external magnetic field because of same sign and subtraction for the induced coil voltage by the parasitic capacitance of opposite sign. Subtracting the coil voltage of $(L^++L^-)$ from that of $(R^++R^-)$, the combination coil voltage as $(R^++R^-)-(L^++L^-)$ gives addition of four signal coil voltages.

As for wiring loop design, two loops are formed by two grade separation 269 and coil terminals 261 to 268 which detect the magnetic field with same sign produced by the pulse current. But two voltages are added with opposite current directions of the loop each other. If the loops have same area with a symmetry, the induced coil voltages in two loops are cancelled to vanish.

The distortion from symmetrical structures on producing the coils and the wiring mentioned above makes the difference between coil voltages which results in the residence ΔVc of the induced coil voltage. The true coil voltage Vs is obtained by subtracting the induced coil voltage Vc measured at Hex=0 from the measured coil voltage Vm using calculation program or operation circuit.

The present Example 1 provides the performance mentioned above under the numbers of the coil turn numbers of 48 turns and the resistance of 220 Ω. The output of the present Example 1 is measured by the GSR sensor circuit having a buffer circuit shown in FIG. 10. It is resulted that the designated output voltage is obtained. As for connection with an elements and ASIC (integrated circuit) of GSR sensor electrodes of elements are soldered to electrodes of ASIC directly.

The circuit 5 shown in FIG. 10 consists of pulse generator 51, GSR element 52, buffer circuit 55, a sample holding circuit 56, programming amplifier 59 and AD converter and digital circuit for signal processing. The pulse generator 51 generates the pulse current with the pulse frequency of 1 GHz passing through the wire of GSR element 52 and the pickup coil of the element detects the coil wave voltage transferring to the buffer circuit 55 following the sample holding circuit 56 to hold the peak voltage which corresponds to the external magnetic field.

The buffer circuit suppress the pulse current through the wire to nearly zero so that IR drop voltage becomes negligible level even if the resistance is large. The peak voltage is inverted to digital signal within 14 bit by an analog digital converter (ADC) transferring to a digital circuit where it is converted to the value of the external magnetic field and is output to outside processors. The digital circuit equips a memory to hold the measured data, calibrate program and initial numerical values.

The Example 1 provides the excellent performance and small size with the length of 0.2 mm and width of 0.2 mm. The performance are noise of 0.2 mG, measuring range of ±50 G, sensitivity of 0.2 mG/bit, measurement interval of 1 msec, and consumption current of 0.1 mA. The above performance is better than that of conventional MI sensor used for electronics compass which are 2 mG, ±12 G, 1.6 mG/bit, 5 msec, 0.4 mA respectively. It is concluded that the performance index of the Example 1 is achieved 160 better than that of conventional MI sensor produced by considering tradeoff relationship between sensor properties.

Figure 7:
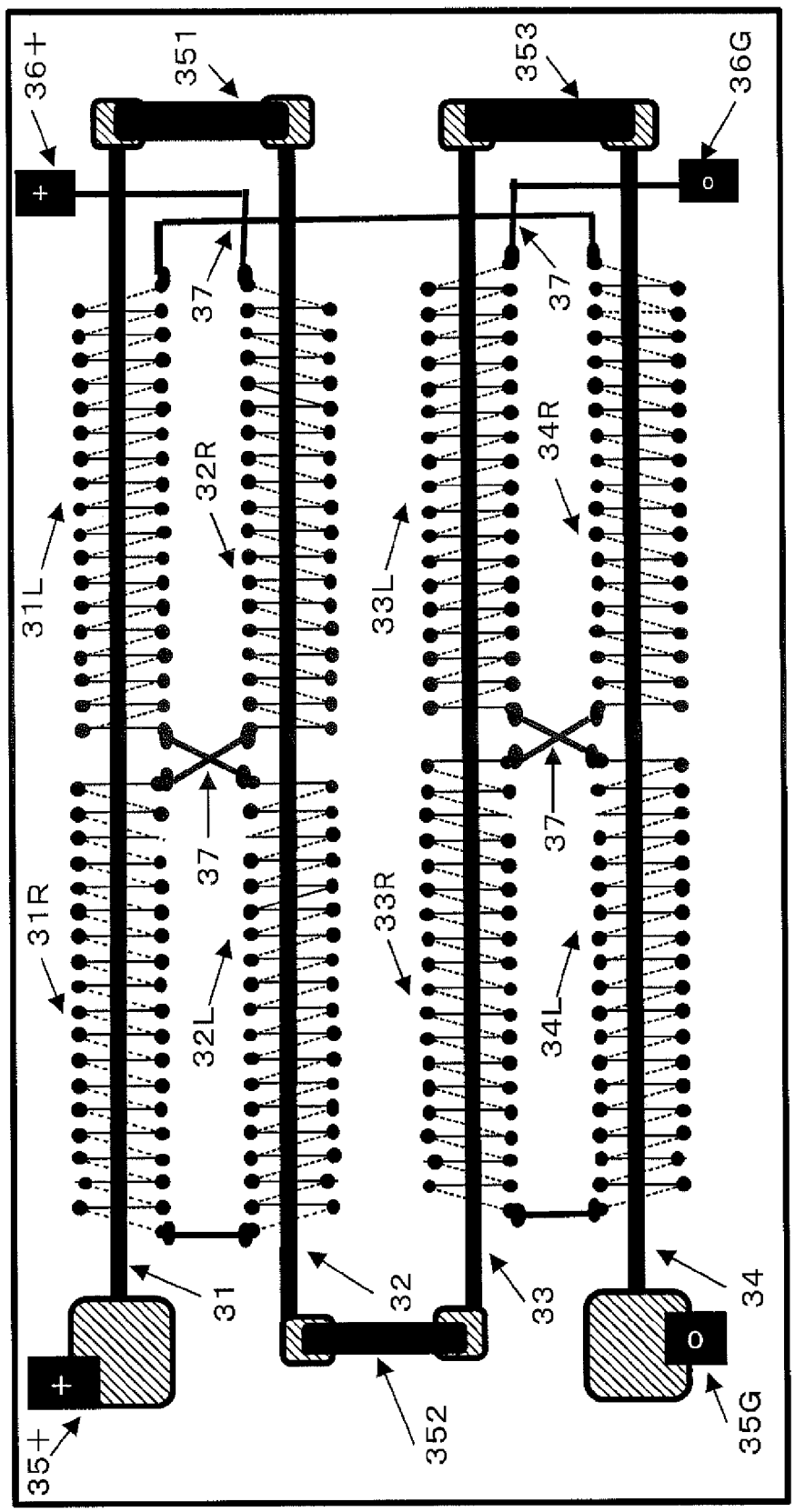
FIG. 7 is a schematic top view of GSR element introduced as Example 2.

The second Example 2 according to the second embodiment of the present invention is applied to pT sensor detecting the bio magnetism of 100 pT level with the noise of 1 pT used for Magneto cardiograph or magneto encephalogram. FIG. 7 shows a top view of the element 3 of the Example 2. That equips four wires binding both right turn coil 31R,32R,33R,34R and left turn coil 31L,32L,33L,34L per each wire passing the pulse through four wires 31,32, 33,34 with opposite direction. The combination coil is expressed as $(R^+ + R^-) - (L^+ + L^-) + (R^+ + R^-) - (L^+ + L^-)$. The pulse current pass through from the pulse wire electrode 35+ through four wires to the grand wire electrode 35G. As for the coil wiring, the coil voltage is added by the wiring connection from plus coil electrode 36+ through 16 coil terminals and 4 grand separations 37 to grand coil electrode 36G.

The present combination coil expressed as $2(R^+ + R^-) - 2(L^+ + L^-)$ provide addition for signal voltage proportional to the external magnetic field and subtraction for the induced coil voltage by the parasitic capacitance 54 of opposite sign.

The wiring loop design with four loops is formed by four grade separations 37 which detects the magnetic field with same sign produced by the pulse current. All of loops make same induced voltage due to same area with opposite current directions of the loop each other. As the wiring connected four loops, it is resulted that the induced coil voltages in the wiring is cancelled to vanish.

Comparing with the Example 1, the wire length of the Example 2 is lengthened from 0.2 mm to 2 mm. The coil turn numbers are increased from 48 turns to 1000 turns, that is, 20 times bigger. The magnetic wire used has excellent magnetic property with the anisotropy of 1.5 G from 5 G. The measuring range is decreased from ±40 G to ±2 G, that is, 20 times smaller. The resistance of the combination coil is 5 kΩ and the wire resistance is 40 Ω.

The above optimum design increases the coil voltage accompanied with increase of the sensitivity and decrease of the noise of 2 pT from 20nT to make detection of the ultra-small bio magnetism of under 100 pT possible at room temperature. The Example 2 for bio magnetism detector provides excellent performance of the noise of 2 pT, measuring range of ±2 G, sensitivity of 1 pT/bit, linearity of under 1%, temperature origin drift of 0.2 pT/degree and current consumption of under 10 mA.

Example 3

The third Example 3 according to the third embodiment of the present invention is applied to industrial use such as home appliance, automotive, Robot and so on detecting the signal magnetic field of 200 G emitted by magnets attached into the artificial system.

As shown in FIG. 8 the combination coil 2 of the present embodiment which has two wires 21,22 binding left turn coil 1L,22L each other passing the pulse from pulse wire electrode 23 through two wires with opposite direction to grand wire electrode 24 and coil wiring connected from pulse coil electrode 26 through coil terminals 261,262,263,264 to grand coil electrode27 expressed as $L^+ + L^-$.

The signal voltage proportional to the external magnetic field is added because of same sign and the induced coil voltage by the parasitic capacitance is cancelled because of opposite sign.

As for wiring loop design, two loops are formed by two grade separation 269 which detects the magnetic field with same sign produced by the pulse current. But two voltages are added with opposite current directions of the loop each other. If the loops have same area with a line symmetry, the induced coil voltages in two loops are cancelled to vanish.

This embodiments are characterized by the wide measuring range of +200 G given by the design with the wire length of 0.08 mm, the coil pitch of 2 μm, and the coil turn numbers of 48 turns keeping other design factors such as the pulse frequency, the magnetic wire, and the electronics circuit to be same to the Example 1.

The performance provides the noise of 1 mG, the measuring range of ±200 G, the linearity of under ±1%, the temperature original drift of 0.1 mG/degree C and the current consumption of 0.1 mA at the measuring cycle of 200 Hz. The Example 3 is suitable for industrial applications such as home appliance, automotive, Robot, electric power sensor and so on.

Example 4

The fourth Example 4 according to the fourth embodiment of the present invention is applied to electronics compass used for medical devices used in human body such as a catheter, a gastro scope and an endoscope. It is characterized by ultra-small element size with the wire diameter of 2 μm and the wire length of 40 μm in addition to the magnetic wire with the anisotropy field of 1.5 G and the diameter of 2 μm, the coil pitch of 1 μm and the coil turn numbers of 32 turns which gives high sensitivity to detecting the earth magnetic field of 0.5 G.

The Example 4 has the combination coil wiring expressed as $(R^+ - L^+)$ shown in FIG. 9 drawing the top view. It has one wire 21 binding right turn coil 21R and left turn coil 21L passing the pulse through one wires with one direction is expressed as $R^+ - L^+$. The coil wiring 21 is connected from the plus coil electrode 23 through four terminals 261, 262, 263, 264 and a grand separation 269 to grand coil electrode 24.

The wiring loop on the substrate 2 is formed by a grade separation 269 and is divided to two sections by the wire passing through pulse current. Both side sections can prepare flux with same strength but opposite sin to achieve zero summation of flux passing through the wiring loop so that the induced coil voltage by wiring loop is vanished.

The performance provides the noise of 2 mG, the measuring range of ±50 G, the linearity of ±1%, the temperature original drift of under 0.02 mG/degree C. and the current consumption of 0.05 mA at the measuring cycle of 200 Hz.

The Example 3 is suitable for electronics compass applications used for medical devices used in human body such as a catheter, a gastro scope and an endoscope.

Example 5

The fifth Example 5 according to the fifth embodiment of the present invention is applied to magnetic imaging applications used for a magnetic microscope, a magnetic camera, a paper money detection and so on characterized by ultra-high measuring speed of 20 MHz.

The Example 5 equips the arrayed GSR elements derived with pulse interval of 50 nsec and each element is detected by high speed switch to output by the measuring cycle of 20 MHz.

INDUSTRIAL APPLICABILITY

The present invention is based on GHz spin rotation phenomena in the surface domain of the amorphous magnetic wire called as GSR effect. It comes true to detect the magnetic field of pT, high sensitivity, very high speed measuring of 20 MHz, and low current consumption with very small size. It is expected for a lot of applications such as electronics compass, magnetic gyro, bio magnetism sensor, micro sensor in medical device used in human body, magnetic camera, and industrial sensor.

longitudinal spin alignment to provide an anisotropy field of the magnetic wire of under 10 G of and the coil with the inner diameter of under 25 μm and the coil pitch of under 10 μm excited by the pulse with the frequency of from 0.5 GHz to 4 GHZ and the current strength to make over 1.5 times larger circular magnetic field than the anisotropy field of the magnetic wire, and wherein the peak coil voltage is detected under a condition to secure the skin depth to make smaller than the thickness of the surface domain to detect only a GSR effect, which means high speed spin rotation with GHz frequency induced in the surface domain, and the peak coil voltage is converted to the external magnetic field using the sine equation (1)

$$Vs = Vo \cdot \sin(\pi H / 2 Hm) \tag{1}$$

where Vs is a coil voltage, Vo is a constant, Hm is a magnetic field to give a maximum coil voltage and H is an external magnetic field.

[Reference Signs List]

10: BH curve
11: Coil voltage vs the external magnetic field    12: Longitudinal cross section of the wire
13: Cross section of the wire    14: Surface domain    15: Core domain    16: Left oriented spin
17: Right oriented spin    18: Spin orientation in the surface domain    19: Spin orientation in the core domain
2: GSR elements for Examples of 1, 2 and 4    21: Left side wire
21+: Plus wire terminal of left side wire    21−: Grand wire terminal of left side wire
22: Right side wire    22+: Plus wire terminal of right side wire
22−: Grand wire terminal of right side wire    21L: Left turn coil of left side wire
21R: Right turn coil of left side wire    22L: Left turn coil of right side wire
22R: Right turn coil of right side wire    23: Plus wire electrode
24: Grand wire electrode    25: Wire connection part
26: Plus coil electrode    27: Grand coil electrode    261 to 268: Coil terminal
269: Grand separation    28: Groove on the substrate
3: GSR element of Example 2    31: First wire    32: Second wire    33: Third wire
34: Fourth wire    31R, 32R, 33R, 34R: Right turn coil    31L, 32L, 33L, 34L: Left turn coil
35+: Plus wire electrode    35G: Grand wire electrode    351, 352, 353: Wire connection part
36+: Plus coil electrode    36G: Grand coil electrode    37: Grand separation
4: Substrate of combination coil    41: Groove on the substrate    42: Magnetic wire    43: Coil
431: Lower side coil wiring    432: Upper side coil wiring    433: Step of joint part
44: Wire terminal    45: Wire electrode    46: Joint part    47: Resign    5: Electronics circuit
51: Pulse generator
52: GSR element    53: Input side circuit    54: Parasitic coil capacitance    55: Buffer circuit
56: Sample hold circuit    57: Electronics switch    58: Sample holding capacitance    59: Amplifier

The invention claimed is:

1. A high sensitive micro sized magnetometer, comprising:
   a detector part with a magnetic wire sensitive to magnetic field and a coil surrounding the magnetic wire, the detector part being configured to pick up a change of longitudinal magnetizing caused by spin rotation in a surface domain with circular spin alignment;
   a pulse generator circuit configured to supply a pulse current to the magnetic wire;
   a buffer circuit and a sample holding circuit, the sample holding circuit comprising an electronic switch synchronized with a pulse current timing for switching the electronic switch on and off, and a holding capacitance to charge a peak coil voltage by switching off the electronic switch; and
   an amplifier circuit configured to amplify the voltage of the holding capacitance and to invert a value of the peak coil voltage to a strength of an external magnetic field,
   wherein the magnetometer, which has the magnetic wire consisting of a domain structure of a surface domain with circular spin alignment and a core domain with 2. The high sensitive micro sized magnetometer according to claim 1, wherein the peak coil voltage is detected by combination coils connected by four types coil of $R^+$, $R^-$, $L^+$, $L^-$ expressed as $(R^+ + R^-)$, $(L^+ + L^-)$, $(R^+ - L^+)$, $(R^- - L^-)$, $(R^+ + R^-) - (L^+ + L^-)$, $R^+ - L^+) + (R^- - L^-)$ where R or L indicate right or left turning coil, respectively, and signs of + or − indicate the direction of the current same to plus or minus direction of the external magnetic field, respectively, to give addition of all signal voltages corresponding to the external magnetic field and vanish all induced coil voltages caused by parasitic coil capacitance.

3. The high sensitive micro sized magnetometer according to claim 1, wherein a combination coil expressed as $(R^+ - L^+)$, $(R^- - L^-)$ consists of one wire surrounding a right turn coil and a left turn coil and the wiring to connect two electrodes and four coil terminals such that a pulse electrode connects to a pulse terminal of a coil through a minus coil terminal, a pulse coil terminal of another coil, the minus coil terminal finally to the minus coil electrode which has a grand separation between coil terminals and electrodes to form a wiring loop which can give addition of all signal voltages corresponding to the external magnetic field and vanish all induced coil voltages induced in the wiring loop.

4. The high sensitive micro sized magnetometer according to claim 1, wherein a combination coil expressed as $(R^++R^-)-(L^++L^-)$, $(R^+-L^+)+(R^--L^-)$ consists of two wires surrounding a right turn coil and a left turn coil and wiring to connect two electrodes and eight coil terminals such that a pulse electrode connects to a pulse terminal of a coil subsequently connecting a minus coil terminal to a pulse coil terminal of another coil and a pulse coil to a minus coil terminal of a next coil in turn to the minus coil electrode which has two grand separations positioned between coil terminals and electrodes to form two loops which can give addition of all signal voltages corresponding to the external magnetic field and vanish all induced coil voltages induced in the wiring loop.

5. The high sensitive micro sized magnetometer according to claim 1, wherein a calculation program or operation circuit is configured to calculate an actual coil voltage by subtracting an induced coil voltage measured at the external magnetic field of zero from a measured coil voltage Vm.

6. The high sensitive micro sized magnetometer according to claim 1, wherein an effect of temperature with respect to the peak coil voltage is calibrated using a temperature sensor and a calibration program.

7. The high sensitive micro sized magnetometer according to claim 1, wherein the magnetic wire is an amorphous or nanostructure wire of CoFeSiB alloy consisting of the core domain with longitudinal spin alignment and the surface domain with circular spin alignment formed by: (i) a tension annealing to make a circular anisotropy; or (ii) a pulse annealing to vanish a magnetic hysteresis using the pulse current with a strong current strength.

\* \* \* \* \*